United States Patent

Platzgummer et al.

(10) Patent No.: US 9,568,907 B2
(45) Date of Patent: Feb. 14, 2017

(54) CORRECTION OF SHORT-RANGE DISLOCATIONS IN A MULTI-BEAM WRITER

(71) Applicant: IMS Nanofabrication AG, Vienna (AT)

(72) Inventors: Elmar Platzgummer, Vienna (AT); Christoph Spengler, Innsbruck (AT); Markus Wagner, Vienna (AT); Samuel Kvasnica, Vienna (AT)

(73) Assignee: IMS Nanofabrication AG, Vienna (AT)

( * ) Notice: Subject to any disclaimer, the term of this patent is extended or adjusted under 35 U.S.C. 154(b) by 0 days.

(21) Appl. No.: 14/845,197

(22) Filed: Sep. 3, 2015

(65) Prior Publication Data

US 2016/0071684 A1 Mar. 10, 2016

Related U.S. Application Data

(60) Provisional application No. 62/046,643, filed on Sep. 5, 2014.

(51) Int. Cl.
| | |
|---|---|
| *G21K 5/04* | (2006.01) |
| *G05B 19/402* | (2006.01) |
| *H01J 37/304* | (2006.01) |
| *H01J 37/317* | (2006.01) |

(52) U.S. Cl.
CPC ......... *G05B 19/402* (2013.01); *H01J 37/3045* (2013.01); *H01J 37/3177* (2013.01); *H01J 2237/31764* (2013.01)

(58) Field of Classification Search
USPC .............. 250/396 R, 397, 492.1, 492.2, 492.21, 250/492.22, 492.23, 492.3
See application file for complete search history.

(56) References Cited

U.S. PATENT DOCUMENTS

| | | | |
|---|---|---|---|
| 1,033,741 | A | 7/1912 | Sims |
| 1,420,104 | A | 6/1922 | Howe et al. |
| 1,903,005 | A | 3/1933 | Mccuen |
| 2,187,427 | A | 1/1940 | Middleton |
| 2,820,109 | A | 1/1958 | Dewitz |
| 2,920,104 | A | 1/1960 | Brooks et al. |

(Continued)

FOREIGN PATENT DOCUMENTS

| | | |
|---|---|---|
| CN | 202204836 U | 4/2012 |
| EP | 1033741 A2 | 9/2000 |

(Continued)

OTHER PUBLICATIONS

US 9,443,052, 09/2016, Platzgummer et al. (withdrawn)

(Continued)

*Primary Examiner* — Nicole Ippolito
(74) *Attorney, Agent, or Firm* — KPPB LLP

(57) ABSTRACT

Method for computing an exposure pattern for exposing a desired pattern on a target in a charged-particle lithography apparatus, in which a particle beam is directed to and illuminates a pattern definition device comprising an aperture array composed of a plurality of blanking apertures through which said particle beam penetrates for writing said desired pattern by exposing a multitude of pixels within an exposure area on the target, said method taking into account a spatially dependent distortion of the target within the exposure area, with respect to dislocations transversal to the direction of the particle beam.

16 Claims, 26 Drawing Sheets

(56) References Cited

U.S. PATENT DOCUMENTS

| | | | |
|---|---|---|---|
| 3,949,265 A | 4/1976 | Holl | |
| 4,467,211 A | 8/1984 | Smith et al. | |
| 4,735,881 A | 4/1988 | Kobayashi et al. | |
| 4,899,060 A | 2/1990 | Lischke | |
| 5,103,101 A | 4/1992 | Berglund et al. | |
| 5,260,579 A | 11/1993 | Yasuda et al. | |
| 5,369,282 A | 11/1994 | Arai et al. | |
| 5,399,872 A | 3/1995 | Yasuda et al. | |
| 5,814,423 A | 9/1998 | Maruyama et al. | |
| 5,841,145 A | 11/1998 | Satoh et al. | |
| 5,847,959 A | 12/1998 | Veneklasen et al. | |
| 5,857,815 A | 1/1999 | Bailey et al. | |
| 5,876,902 A | 3/1999 | Veneklasen et al. | |
| 5,933,211 A | 8/1999 | Nakasugi et al. | |
| 6,014,200 A | 1/2000 | Sogard et al. | |
| 6,043,496 A | 3/2000 | Tennant | |
| 6,049,085 A | 4/2000 | Ema | |
| 6,111,932 A | 8/2000 | Dinsmore | |
| 6,137,113 A | 10/2000 | Muraki | |
| 6,225,637 B1 | 5/2001 | Terashima et al. | |
| 6,229,595 B1 | 5/2001 | McKinley et al. | |
| 6,252,339 B1 | 6/2001 | Kendall | |
| 6,280,798 B1 | 8/2001 | Ring et al. | |
| 6,333,138 B1 | 12/2001 | Higashikawa et al. | |
| 6,472,673 B1 | 10/2002 | Chalupka et al. | |
| 6,473,237 B2 | 10/2002 | Mei | |
| 6,552,353 B1 | 4/2003 | Muraki et al. | |
| 6,617,587 B2 | 9/2003 | Parker | |
| 6,767,125 B2 | 7/2004 | Midas et al. | |
| 6,768,123 B2 | 7/2004 | Giering | |
| 6,768,125 B2 | 7/2004 | Platzgummer et al. | |
| 6,835,937 B1 | 12/2004 | Muraki et al. | |
| 6,858,118 B2 | 2/2005 | Platzgummer et al. | |
| 6,897,454 B2 | 5/2005 | Sasaki et al. | |
| 6,965,153 B1 | 11/2005 | Ono et al. | |
| 7,084,411 B2 | 8/2006 | Lammer-Pachlinger et al. | |
| 7,124,660 B2 | 10/2006 | Chiang | |
| 7,129,024 B2 | 10/2006 | Ki | |
| 7,199,373 B2 | 4/2007 | Stengl et al. | |
| 7,201,213 B2 | 4/2007 | Leeson et al. | |
| 7,214,951 B2 | 5/2007 | Stengl et al. | |
| 7,276,714 B2 | 10/2007 | Platzgummer et al. | |
| 7,459,247 B2 | 12/2008 | Bijnen et al. | |
| 7,687,783 B2 | 3/2010 | Platzgummer et al. | |
| 7,710,634 B2 | 5/2010 | Sandstrom | |
| 7,714,298 B2 | 5/2010 | Platzgummer et al. | |
| 7,741,620 B2 | 6/2010 | Doering et al. | |
| 7,772,574 B2 | 8/2010 | Stengl et al. | |
| 7,777,201 B2 | 8/2010 | Fragner et al. | |
| 7,781,748 B2 | 8/2010 | Platzgummer et al. | |
| 7,823,081 B2 | 10/2010 | Sato et al. | |
| 8,057,972 B2 | 11/2011 | Heinrich et al. | |
| 8,183,543 B2 | 5/2012 | Platzgummer et al. | |
| 8,198,601 B2 | 6/2012 | Platzgummer et al. | |
| 8,222,621 B2 | 7/2012 | Fragner et al. | |
| 8,227,768 B2 | 7/2012 | Smick et al. | |
| 8,257,888 B2 | 9/2012 | Sczyrba et al. | |
| 8,258,488 B2 | 9/2012 | Platzgummer et al. | |
| 8,294,117 B2 | 10/2012 | Kruit et al. | |
| 8,304,749 B2 | 11/2012 | Platzgummer et al. | |
| 8,378,320 B2 | 2/2013 | Platzgummer | |
| 8,502,174 B2 | 8/2013 | Wieland | |
| 8,546,767 B2 | 10/2013 | Platzgummer et al. | |
| 8,563,942 B2 | 10/2013 | Platzgummer | |
| 8,598,544 B2 | 12/2013 | Van De Peut et al. | |
| 9,053,906 B2 | 6/2015 | Platzgummer | |
| 9,093,201 B2 | 7/2015 | Platzgummer et al. | |
| 9,099,277 B2 | 8/2015 | Platzgummer | |
| 9,188,874 B1* | 11/2015 | Johnson | G03F 7/70291 |
| 9,269,543 B2 | 2/2016 | Reiter et al. | |
| 9,373,482 B2 | 6/2016 | Platzgummer | |
| 9,443,699 B2 | 9/2016 | Platzgummer et al. | |
| 2001/0028038 A1 | 10/2001 | Hamaguchi et al. | |
| 2002/0021426 A1 | 2/2002 | Mei et al. | |
| 2002/0148978 A1 | 10/2002 | Innes et al. | |
| 2003/0085360 A1 | 5/2003 | Parker et al. | |
| 2003/0106230 A1 | 6/2003 | Hennessey | |
| 2003/0155534 A1 | 8/2003 | Platzgummer et al. | |
| 2003/0160980 A1 | 8/2003 | Olsson et al. | |
| 2004/0058536 A1 | 3/2004 | Ki | |
| 2004/0119021 A1 | 6/2004 | Parker et al. | |
| 2004/0157407 A1 | 8/2004 | Qin-Yi et al. | |
| 2004/0169147 A1 | 9/2004 | Ono et al. | |
| 2005/0063510 A1 | 3/2005 | Hieronimi et al. | |
| 2005/0072941 A1 | 4/2005 | Tanimoto et al. | |
| 2005/0104013 A1 | 5/2005 | Stengl et al. | |
| 2005/0242302 A1 | 11/2005 | Platzgummer et al. | |
| 2005/0242303 A1 | 11/2005 | Platzgummer | |
| 2006/0060775 A1 | 3/2006 | Sakakibara et al. | |
| 2006/0076509 A1 | 4/2006 | Okino et al. | |
| 2006/0169925 A1 | 8/2006 | Miyajima et al. | |
| 2007/0138374 A1 | 6/2007 | Nishibashi et al. | |
| 2007/0178407 A1 | 8/2007 | Hatakeyama et al. | |
| 2007/0279768 A1 | 12/2007 | Shibazaki et al. | |
| 2008/0024745 A1 | 1/2008 | Baselmans et al. | |
| 2008/0080782 A1 | 4/2008 | Olsson et al. | |
| 2008/0099693 A1 | 5/2008 | Platzgummer et al. | |
| 2008/0105827 A1 | 5/2008 | Tamamushi | |
| 2008/0128638 A1* | 6/2008 | Doering | B82Y 10/00 250/492.2 |
| 2008/0142728 A1 | 6/2008 | Smick et al. | |
| 2008/0198352 A1 | 8/2008 | Kugler et al. | |
| 2008/0203317 A1 | 8/2008 | Platzgummer et al. | |
| 2008/0237460 A1 | 10/2008 | Fragner et al. | |
| 2008/0257096 A1 | 10/2008 | Zhu et al. | |
| 2008/0260283 A1* | 10/2008 | Ivansen | B82Y 10/00 382/266 |
| 2008/0283767 A1 | 11/2008 | Platzgummer | |
| 2008/0299490 A1 | 12/2008 | Takekoshi | |
| 2009/0032700 A1 | 2/2009 | Park et al. | |
| 2009/0101816 A1 | 4/2009 | Noji et al. | |
| 2009/0256075 A1 | 10/2009 | Kemen et al. | |
| 2009/0321631 A1 | 12/2009 | Smick et al. | |
| 2010/0127185 A1 | 5/2010 | Fragner et al. | |
| 2010/0178602 A1 | 7/2010 | Seto et al. | |
| 2010/0187434 A1 | 7/2010 | Platzgummer et al. | |
| 2010/0288938 A1 | 11/2010 | Platzgummer | |
| 2011/0053087 A1 | 3/2011 | Nielsen et al. | |
| 2011/0073672 A1 | 3/2011 | Wieland | |
| 2011/0204253 A1 | 8/2011 | Platzgummer et al. | |
| 2011/0226968 A1* | 9/2011 | Platzgummer | B82Y 10/00 250/492.3 |
| 2012/0076269 A1 | 3/2012 | Roberts et al. | |
| 2012/0085940 A1 | 4/2012 | Matsumoto | |
| 2012/0211674 A1 | 8/2012 | Kato | |
| 2012/0286169 A1 | 11/2012 | Van De Peut et al. | |
| 2012/0286170 A1 | 11/2012 | Van De Peut et al. | |
| 2012/0288787 A1 | 11/2012 | Choi et al. | |
| 2013/0157198 A1 | 6/2013 | Ogasawara et al. | |
| 2013/0164684 A1 | 6/2013 | Yamanaka | |
| 2013/0198697 A1 | 8/2013 | Hotzel et al. | |
| 2013/0252145 A1 | 9/2013 | Matsumoto et al. | |
| 2013/0253688 A1 | 9/2013 | Matsumoto et al. | |
| 2014/0042334 A1 | 2/2014 | Wieland | |
| 2014/0197327 A1 | 7/2014 | Platzgummer | |
| 2014/0240732 A1 | 8/2014 | Tinnemans et al. | |
| 2014/0322927 A1 | 10/2014 | Morita | |
| 2014/0346369 A1 | 11/2014 | Matsumoto | |
| 2015/0021493 A1 | 1/2015 | Platzgummer | |
| 2015/0028230 A1 | 1/2015 | Platzgummer | |
| 2015/0069260 A1 | 3/2015 | Platzgummer | |
| 2015/0243480 A1 | 8/2015 | Yamada et al. | |
| 2015/0248993 A1 | 9/2015 | Reiter et al. | |
| 2015/0311030 A1 | 10/2015 | Platzgummer et al. | |
| 2015/0311031 A1 | 10/2015 | Platzgummer et al. | |
| 2016/0012170 A1 | 1/2016 | Platzgummer | |
| 2016/0013019 A1 | 1/2016 | Platzgummer | |

FOREIGN PATENT DOCUMENTS

| | | |
|---|---|---|
| EP | 2019415 A1 | 1/2009 |
| EP | 2187427 A2 | 5/2010 |
| EP | 2214194 A1 | 8/2010 |
| EP | 2317535 A2 | 5/2011 |

(56) References Cited

FOREIGN PATENT DOCUMENTS

| | | | |
|---|---|---|---|
| EP | 2363875 | A1 | 9/2011 |
| GB | 2349737 | A | 11/2000 |
| JP | 08213301 | A | 8/1996 |
| JP | 2006019436 | A | 1/2006 |
| JP | 2006332289 | A | 12/2006 |
| WO | 2006084298 | A1 | 8/2006 |
| WO | 2008053140 | A1 | 5/2008 |
| WO | 2009147202 | A1 | 12/2009 |
| WO | 2012172913 | A1 | 12/2012 |

OTHER PUBLICATIONS

European Search Report for Application 14165967, report dated Oct. 30, 2014, 2 pgs.
European Search Report for Application 14165970, report dated Jun. 18, 2014, 2 pgs.
European Search Report for Application 14170611, report dated Nov. 4, 2014, 3 pgs.
European Search Report for Application 14176563, report dated Jan. 14, 2015, 2 pgs.
European Search Report for Application 14199183, report dated Jun. 19, 2015, 2 pgs.
European Search Report for Application 15164770, report dated Sep. 18, 2015, 2 pgs.
European Search Report for Application 15164772, report dated Sep. 11, 2015, 2 pgs.
European Search Report for Application 15169632, report dated Oct. 20, 2015, 3 pgs.
European Search Report for Application 15171348, report dated Oct. 30, 2015, 2 pgs.
Borodovsky, Yan , "EUV, EBDW—ARF Replacement or Extension?", KLA-Tencor Lithography User Forum, Feb. 21, 2010, San Jose, CA, USA.
Borodovsky, Yan, "MPProcessing for MPProcessors", SEMATECH Maskless Lithography and Multibeam Mask Writer Workshop, May 10, 2010, New York, NY, USA.
Li, H. Y. et al., "Through-Silicon Interposer Technology for Heterogeneous Integration", Future Fab Intl., Issue 45 (Apr. 25, 2013).
Paraskevopoulos, A. et al., "Scalable (24-140 Gbps) optical data link, well adapted for future maskless lithography applications", Proc. SPIE vol. 7271, 72711 I (2009).
Platzgummer, Elmar et al., "eMET POC: Realization of a proof-of-concept 50 keV electron multibeam Mask Exposure Tool", Proc. of SPIE vol. 8166, 816622-1, 2011.
European Search Report for Application No. EP 09450211.9-1226, Report dated Sep. 9, 2014, 4 Pgs.
European Search Report for Application No. EP 09450212.7, Report dated Sep. 28, 2010, 9 Pgs.
European Search Report for Application No. EP 14177851, Report dated Oct. 16, 2014, 1 Pg.
European Search Report for Application No. EP 14176645, Completed Dec. 1, 2014, 1 Pg.
European Search Report for Application No. EP 08450077.6, Dated Jan. 29, 2010.
European Search Report for Application No. 141501197.7, Dated Jun. 6, 2014, 2 Pgs.
European Search Report for European Application No. 10450070.7, Dated May 7, 2012, 13 Pgs.
Berry et al., "Programmable aperture plate for maskless high-throughput nanolithography", J. Vac. Sci. Technol., Nov./Dec. 1997, vol. B15, No. 6, pp. 2382-2386.
Disclosed Anonymously, "Multi-tone rasterization, dual pass scan, data path and cell based vector format", IPCOM000183472D, printed from ip.com PriorArtDatabase, published May 22, 2009, 108 pages.
Kapl et al., "Characterization of CMOS programmable multi-beam blanking arrays as used for programmable multi-beam projection lithography and reisitless nanopatterning", Journal of Micromechanics and Microengineering, 21 (2001), pp. 1-8.
Platzgummer et al., "eMET—50keV electron Mask Exposure Tool Development based on proven multi-beam projection technology", Proc. of SPIE, vol. 7823, pp. 782308-1-782308-12.
Zhang et al., "Integrated Multi-Electron-Beam Blanker Array for Sub-10-nm Electron Beam Induced Deposition", J. Vac. Sci. Technol., Nov./Dec. 2006, vol. B24, No. 6, pp. 2857-2860.
European Search Report for Application 15159397.7, report dated Sep. 28, 2015, 8 pgs.
European Search Report for Application 15159617.8, report dated Oct. 19, 2015, 4 pgs.
Wheeler et al, "Use of Electron Beams in VLSI", G.E.C.Journal of Science and Technology, General Electric Company. Wembley, Middlesex, GB, vol. 48, No. 2, Jan. 1, 1982, pp. 103-107, XP000820522.

\* cited by examiner

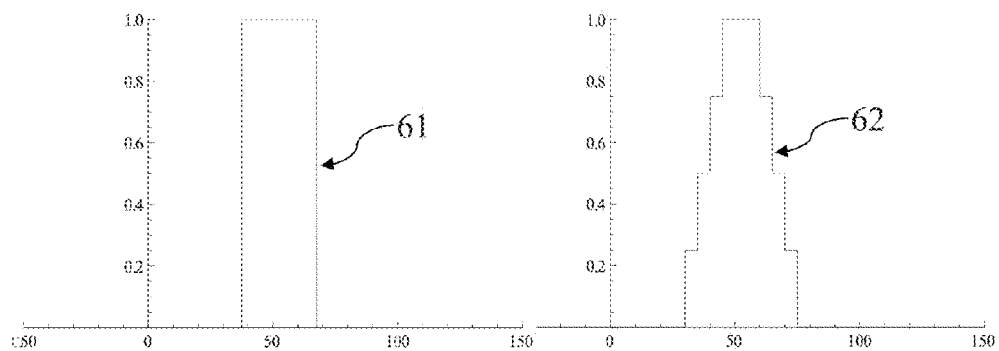
Fig. 3A
(Prior Art)
Fig. 3B
(Prior Art)
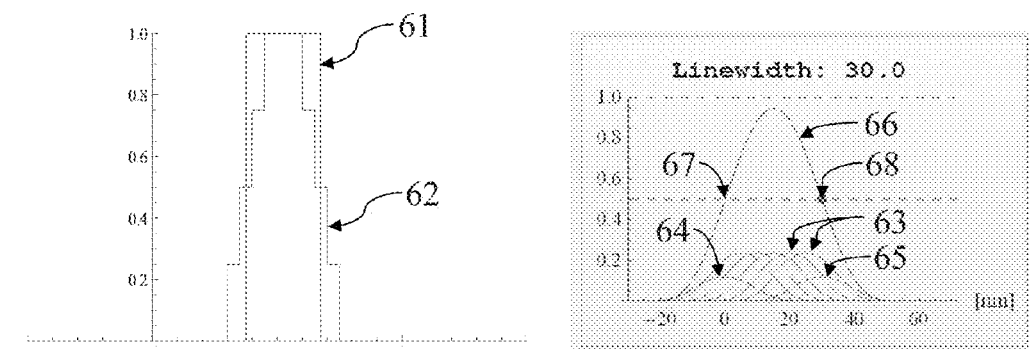
Fig. 3C
(Prior Art)
Fig. 3D
(Prior Art)

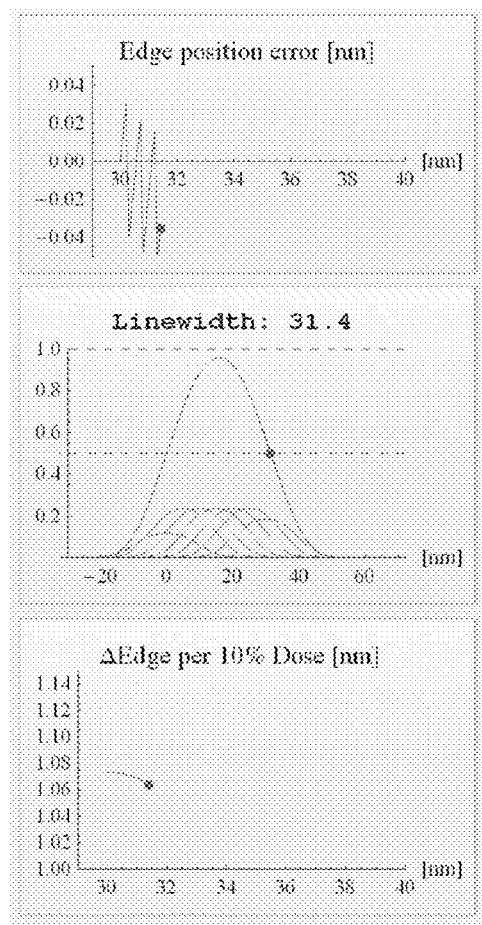
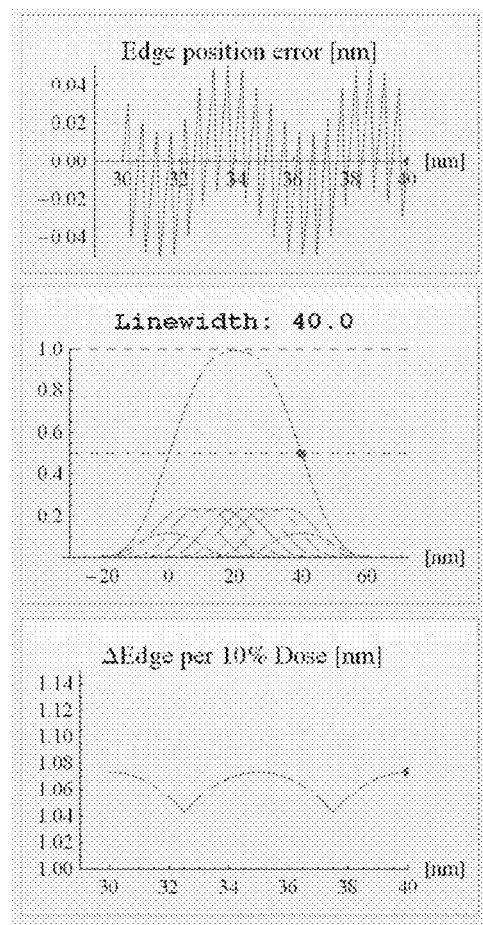
Fig. 4A
(Prior Art)
Fig. 4B
(Prior Art)

91'

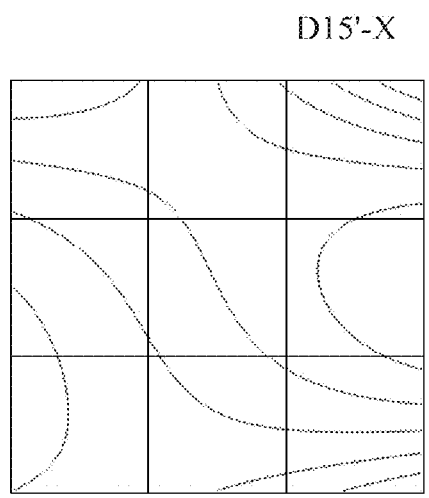
Fig. 15B
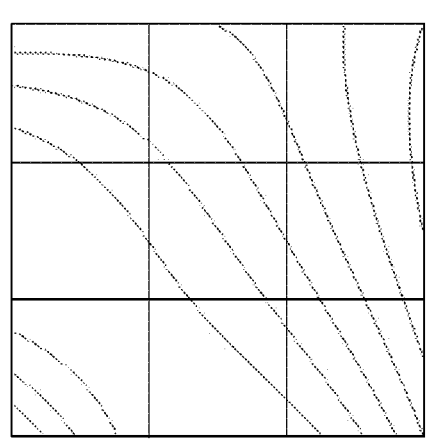
Fig. 15C
D15'-X
Fig. 15D
D15'-Y
Fig. 15E

CORRECTION OF SHORT-RANGE DISLOCATIONS IN A MULTI-BEAM WRITER

CROSS REFERENCE TO RELATED APPLICATIONS

This application claims priority to U.S. Provisional Application No. 62/046,643 filed on Sep. 5, 2014, the disclosure of which is hereby incorporated by reference in its entirety.

FIELD OF THE INVENTION AND DESCRIPTION OF PRIOR ART

Embodiments of the invention relate to the field of charged-particle multi-beam processing apparatuses for the exposure of a target by means of a structured beam of electrically charged particles, and in particular to a method for computing an exposure pattern for exposing a desired pattern on a target in a charged-particle lithography apparatus. In such an apparatus a particle beam is generated in an illumination system, is directed to and illuminates a pattern definition device comprising an aperture array composed of a plurality of blanking apertures through which said particle beam penetrates and is then imaged by a projection optics system onto a target, for writing said desired pattern by exposing a multitude of pixels within an exposure area on the target.

The applicant has realized charged-particle multi-beam tools of the mentioned type and developed corresponding charged-particle optics, pattern definition (PD) device, and multi-beam writing method, in particular a 50 keV electron multi-beam writer to realize leading-edge complex photomasks for 193 nm immersion lithography, of masks for EUV lithography and of templates (1× masks) for imprint lithography. The system is called eMET (electron Mask Exposure Tool) or MBMW (multi-beam mask writer) for exposing 6" mask blank substrates. The multi-beam system has been called PML2 (Projection Mask-Less Lithography) for electron beam direct writer (EBDW) applications on Silicon wafer substrates. The multi-beam column and writing method can also be used for multi-beam inspection applications.

The schematics of the multi-beam writer are shown in FIG. 1. Such a lithographic apparatus is well known in prior art, such as U.S. Pat. No. 6,768,125, EP 2 187 427 A1 (=U.S. Pat. No. 8,222,621) and EP 2 363 875 A1 (=U.S. Pat. No. 8,378,320). In the following, only those details are given as needed to disclose certain embodiments of the invention such that one of ordinary skill in the art can practice the various embodiments of the invention; for the sake of clarity, the components are not shown to size in FIG. 1. The main components of the lithography apparatus 1 are—corresponding to the direction of the lithography beam lb, pb which in this example runs vertically downward in FIG. 1—an illumination system 3, a pattern definition (PD) system 4, a projecting system 5, and a target station 6 with the substrate 16. The whole apparatus 1 is contained in a vacuum housing 2 held at high vacuum to ensure an unimpeded propagation of the beam lb, pb along the optical axis cx of the apparatus. The charged-particle optical systems 3, 5 are realized using electrostatic and/or magnetic lenses.

The illumination system 3 comprises, for instance, an electron gun 7, an extraction system 8 as well as a condenser lens system 9. It should, however, be noted that in place of electrons, in general, other electrically charged particles can be used as well. Apart from electrons these can be, for instance, hydrogen ions or heavier ions, charged atom clusters, or charged molecules.

The extraction system 8 accelerates the particles to a defined energy of typically several keV, e.g. 5 keV. By means of a condenser lens system 9, the particles emitted from the source 7 are formed into a wide, substantially telecentric particle beam 50 serving as lithography beam lb. The lithography beam lb then irradiates a PD system 4 which comprises a number of plates with a plurality of openings or apertures 24 (FIG. 2). The PD system 4 is held at a specific position in the path of the lithography beam lb, which thus irradiates the plurality of apertures and is split up into a number of beamlets.

Referring to FIG. 2, some of the apertures 24 of the PD system 4 are "switched on" or "open" so as to be transparent to the incident beam in the sense that they allow the portion of the beam (beamlets 51) that is transmitted through it to reach the target; the other apertures are "switched off" or "closed", i.e. the corresponding beamlets 52 cannot reach the target, and thus effectively these apertures and/or openings are non-transparent (opaque) to the beam. Thus, the lithography beam lb is structured into a patterned beam pb, emerging from the PD system 4. The pattern of switched on apertures—the only portions of the PD system 4 which are transparent to the lithography beam lb—is chosen according to a pattern which is to be exposed on the target 16. It has to be noted that the "switching on/off" of the beamlets usually is realized by some sort of deflection means provided in one of the plates of the PD system 4: "Switched off"-beamlets are deflected off their path (by very small angles) so they cannot reach the target but are merely absorbed somewhere in the lithography apparatus, e.g. by an absorbing plate 11.

The pattern as represented by the patterned beam pb is then projected by means of an electro-magneto-optical projection system 5 onto the substrate 16 where it forms an image of the "switched-on" apertures and/or openings. The projection system 5 implements a demagnification of, for instance, 200:1 with two crossovers c1 and c2. The target or "substrate" 16 is, for instance, a 6" mask blank or a silicon wafer covered with a particle sensitive resist layer 17. The substrate is held by a chuck 15 and positioned by a substrate stage 14 of the target station 6.

The information regarding the pattern to be exposed is supplied to the PD system 4 by a data path realized by means of an electronic pattern information processing system 18. (Also see discussion of FIGS. 14A and 14B below.)

In the embodiment shown in FIG. 1, the projection system 5 is composed of a number of consecutive electro-magneto-optical projector stages 10a, 10b, 10c, consisting of electrostatic and/or magnetic lenses and other deflection means. These lenses and means are shown in symbolic form only, since their application is well known in the prior art. The projection system 5 employs a demagnifying imaging through crossovers c1, c2. The demagnification factor for both stages is chosen such that an overall demagnification of several hundred results, e.g. 200:1. A demagnification of this order is in particular suitable with a lithography setup, in order to alleviate problems of miniaturization in the PD device.

In the whole projection system 5, provisions are made to extensively compensate chromatic and geometric aberrations. As a means to shift the image laterally as a whole, i.e. along a direction perpendicular to the optical axis cx, deflection means 12a, 12b and 12c are provided in the condenser 3 and projection system 5. The deflection means can be realized as, for instance, a multipole electrode system which is positioned near the source extraction system (12a), near the first crossover, as shown in FIG. 1 with the deflection means 12b, and/or after the final lens 10c of the respective projector, as in the case with the stage deflection means 12c in FIG. 1. In this apparatus, a multipole electrode arrangement is used as deflection means both for shifting the image in relation to the stage motion and for correction of the imaging system in conjunction with the charged-particle optics alignment system. These deflection means 10a, 10b, 10c are not to be confused with the deflection array means of the PD system 4 which, in conjunction with the stopping plate 11, are used to switch selected beamlets of the patterned beam pd to "on" or "off" state, since the former only deal with the particle beam as a whole. There is also the possibility to rotate the ensemble of programmable beams using a solenoid 13 providing an axial magnetic field.

As can be seen in the sectional detail of FIG. 2, the PD system 4 preferably comprises three plates stacked in a consecutive configuration: An "Aperture Array Plate" (AAP) 20, a "Deflection Array Plate" (DAP) 30 and a "Field-boundary Array Plate" (FAP) 40. It is worthwhile to note that the term 'plate' refers to an overall shape of the respective device, but does not necessarily indicate that a plate is realized as a single plate component even though the latter is usually the preferred way of implementation; still, in certain embodiments, a 'plate', such as the aperture array plate, may be composed of a number of sub-plates. The plates are preferably arranged parallel to each other, at mutual distances along the Z direction.

The flat upper surface of AAP 20 forms a defined potential interface to the condenser optics/illumination system 11. The AAP may, e.g. be made from a square or rectangular piece of a silicon wafer (approx. 1 mm thickness) 21 with a thinned center part 22. The plate may be covered by an electrically conductive protective layer 23 which will be particularly advantageous when using hydrogen or helium ions (line in U.S. Pat. No. 6,858,118). When using electrons or heavy ions (e.g. argon or xenon), the layer 23 may also be of silicon provided by the surface section of 21 and 22, respectively, so that there is no interface between layer 23 and bulk parts 21/22, respectively.

The AAP 20 is provided with a plurality of apertures 24 realized as openings traversing the thinned part 22. In the embodiment shown the apertures 24 are realized having a straight profile fabricated into the layer 23 and a "retrograde" profile in the bulk layer of the AAP 20 such that the downward outlets 25 of the openings are wider than in the main part of the apertures 24. Both the straight and retrograde profiles can be fabricated with state-of-the-art structuring techniques such as reactive ion etching. The retrograde profile strongly reduces mirror charging effects of the beam passing through the opening.

The DAP 30 is a plate provided with a plurality of openings 33, whose positions correspond to those of the apertures 24 in the AAP 20, and which are provided with electrodes 35, 38 configured for deflecting the individual sub-beams passing through the openings 33 selectively from their respective paths. The DAP 30 can, for instance, be fabricated by post-processing a CMOS wafer with an ASIC circuitry. The DAP 30 is, for instance, made from a piece of a CMOS wafer having a square or rectangular shape and comprises a thicker part 31 forming a frame holding a center part 32 which has been thinned (but may be suitably thicker as compared to the thickness of 22). The aperture openings 33 in the center part 32 are wider compared to the apertures 24 (by approx. 2 µm at each side for instance). CMOS electronics 34 is used to control the electrodes 35, 38, which are provided by means of MEMS techniques. Adjacent to each opening 33, a "ground" electrode 35 and a deflection electrode 38 are provided. The ground electrodes 35 are electrically interconnected, connected to a common ground potential, and comprise a retrograde part 36 to prevent charging and an isolation section 37 in order to prevent unwanted shortcuts to the CMOS circuitry. The ground electrodes 35 may also be connected to those parts of the CMOS circuitry 34 which are at the same potential as the silicon bulk portions 31 and 32.

The deflection electrodes 38 are configured to be selectively applied an electrostatic potential; when such electrostatic potential is applied to an electrode 38, this will generate an electric field causing a deflection upon the corresponding sub-beam, deflecting it off its nominal path. The electrodes 38 as well may have a retrograde section 39 in order to avoid charging. Each of the electrodes 38 is connected at its lower part to a respective contact site within the CMOS circuitry 34.

The height of the ground electrodes 35 is higher than the height of the deflection electrodes 38 in order to suppress cross-talk effects between the beams.

The arrangement of a PD system 12 with a DAP 30 having electrodes oriented downstream as shown in FIG. 2 is only one of several possibilities. Further DAP configurations, e.g. with embedded ground and deflection electrodes, can easily be devised by the skilled person (see other patents in the name of the applicant, such as U.S. Pat. No. 8,198,601 B2).

The third plate 40 serving as FAP has a flat surface facing to the first lens part of the down-stream demagnifying charged-particle projection optics and thus provides a defined potential interface to the first lens 16a of the projection optics. The thicker part 41 of FAP 40 is a square or rectangular frame made from a part of a silicon wafer, with a thinned center section 42. The FAP 40 is provided with a plurality of openings 43 which correspond to the openings 24, 33 of the AAP 20 and DAP 30 but are wider as compared to the latter.

The PD system 4, and in particular the first plate thereof, the AAP 20, is illuminated by a broad charged particle beam 50 (herein, "broad" beam means that the beam is sufficiently wide to cover the entire area of the aperture array formed in the AAP), which is thus divided into many thousands of micrometer-sized beams 51 when transmitted through the apertures 24. The beamlets 51 and 52 will traverse the DAP and FAP unhindered.

As already mentioned, whenever a deflection electrode 38 is powered through the CMOS electronics, an electric field will be generated between the deflection electrode and the corresponding ground electrode, leading to a small but sufficient deflection of the respective beam 52 passing through (FIG. 2). The deflected beam can traverse the DAP and FAP unhindered as the openings 33 and 43, respectively, are made sufficiently wide. However, the deflected beam 52 is filtered out at the stopping plate 15 of the sub-column (FIG. 1). Thus, only those beams which are unaffected by the DAP will reach the substrate.

The reduction factor of the demagnifying charged-particle optics 16 is chosen suitably in view of the dimensions of the beams and their mutual distance in the PD device 4 and the desired dimensions of the structures at the target. This will allow for micrometer-sized beams at the PD system whereas nanometer-sized beams are projected onto the substrate.

The ensemble of (unaffected) beams 51 as formed by AAP is projected to the substrate with a predefined reduction factor R of the projection charged-particle optics. Thus, at the substrate a "beam array field" (BAF) is projected having widths BX=AX/R and BY=AY/R, respectively, where AX and AY denote the sizes of the aperture array field along the X and Y directions, respectively. The beam size of an individual beam at the substrate is given by bX=aX/R and by=aY/R, respectively, where aX and aY denote the sizes of the beam 51 as measured along the X and Y directions, respectively, at the level of the DAP 30.

It is worthwhile to note that the individual beams 51, 52 depicted in FIG. 2 are representative of a much larger number of sub-beams, typically many thousands, arranged in a two-dimensional X-Y array. The applicant has, for instance, realized multi-beam charged-particle optics with a reduction factor of R=200 for ion as well as electron multi-beam columns with many thousands (e.g., 262,144) programmable beams. The applicant has realized such columns with a beam array field of approx. 82 µm×82 µm at the substrate. These examples are stated for illustrative purpose, but are not to be construed as limiting examples.

As a typical implementation of an MBMW, the applicant has realized a 50 keV electron MBMW providing 512×512 (262,144) programmable beamlets of 20 nm beam size within a 81.92 µm×81.92 µm beam array field at the substrate. For the realized writer system the substrate is a 6" mask blank (area: 6"×6"=152.4 mm×152.4 mm, thickness: 1"/4=6.35 mm) covered with an electron beam sensitive resist. Furthermore, in the realized system of the applicant multi-beam writing is possible on resist covered 150 mm Si wafers.

The current density of the realized MBMW system of the applicant is ≤1 A/cm$^2$ when using 20 nm beam size. Thus, when all programmable 262,144 beamlets are "on" the current is ≤1.05 µA.

The MBMW column as realized by the applicant has a 1 sigma blur of approx. 5 nm, as verified experimentally and published in "eMET POC: Realization of a proof-of-concept 50 keV electron multibeam Mask Exposure Tool", by Elmar Platzgummer et al., in Proc. of SPIE Vol. 8166, 816622-1 (2011).

There is the possibility to change the beam size from 20 nm to e.g. 10 nm. For a column with 200:1 reduction this is straightforward by using an aperture array plate (AAP) with 2 µm×2 µm opening size of the apertures instead of 4 µm×4 µm opening size. As outlined in U.S. Pat. No. 8,546,767 of the applicant, there is also a possibility of an in-situ change of the beam size.

When using 10 nm beam size and providing a current density at the substrate of no higher than 4 A/cm$^2$ the current of 262,144 programmable beamlets is again 1.05 µA at maximum. Thus, also in this case there is virtually no change of the 1 sigma column blur with current through the column.

The first generation MBMW production tools are targeted to use 20 nm and 10 nm beams providing up to approx. 1 µA current for all 262,144 programmable beams "on". For following generations of MBMW production tools there is the plan to use even smaller beam size of e.g. 8 nm and concurrently to provide e.g. 640×640=409,600 beamlets within the 81.92 µm×81.92 µm beam array field at the substrate. Keeping the maximum current density at 4 A/cm$^2$ will ensure that the maximum current (with all beamlets "on") is 1.05 µA. For instance, using a 5 nm beam size there allows providing e.g. 1024×1024=1,048,576 programmable beams within the 81.92 µm×81.92 beam array field at the substrate. again, at a maximum current density of 4 A/cm$^2$ the maximum current (with all beamlets "on") is 1.05 µA.

The multi-beam writing method proposed by the applicant also includes a method using the same spot size, e.g. 20 nm, with an overlap between the spots, with a selected amount of overlap. In the "Double Grid" multi-beam exposure, the overlap between the spots is half of the beam size in X as well as in Y direction. In the "Quad Grid" multi-beam exposure, the overlap between the spots is a quarter of the beam size in X as well as in Y direction. The spot size at the substrate is aX/R where aX is the opening width of the apertures in the aperture array plate (FIG. 2) and R is the reduction factor of the charged-particle projection optics. Each spot is exposed with discrete dose levels. For instance, when using 4 bits for programming the dose levels, the dose level of each spot can be selected to be 0, 1, 2, . . . 14, or 15 units.

In FIG. 3A, an illustration for the case of a zero blur, the ideal intensity profile 61 is shown for a line with 30 nm width. When using "Quad Grid" multi-beam exposure, the overlap is a quarter of the beam size. Thus, for the case of using 20 nm beam size the physical grid size is 5 nm. A discrete dose level can be assigned to each physical grid area, which is 5 nm×5 nm for the example shown, and in FIG. 3B the discrete dose levels 62 applied for generating the 30 nm line are indicated. FIG. 3C shows the superposition of the zero blur intensity profile 61 (FIG. 3A) and the dose level histogram 62 (FIG. 3B). In the general case the dose level histogram will not be symmetrical in order to position the left and right edge at pre-defined positions. In FIG. 3D a simulation is shown for a line of 30.0 nm width with the left edge to be positioned at 0.0 nm and the right edge at 30.0 nm. For the simulation, exposure of 20 nm beam spots with a 1 sigma blur of 5.1 nm (12.0 nm FWHM blur) was assumed. The intensity profile 66 is formed by overlapping exposure spots 63, 64, and 65. The dose level of the leftmost exposure spot 64 is adjusted such that the 30 nm line starts at position 67, i.e. the desired 0.0 nm position. The dose level of the rightmost exposure spot 65 is adjusted such that exposed line ends at 68 with 30.0 nm width. As shown in FIG. 3D, the overlap of the 20 nm exposure spots 63, 64, 65 is a quarter of the beam size, i.e. 5 nm ("Quad Grid").

Using the multi-beam exposure tool with 20 nm beam size and Quad Grid exposure (5 nm physical grid size), the line width can be changed in steps of 0.1 nm. As examples, FIG. 4A shows the intensity profile for 31.4 nm line width and FIG. 4B for 40.0 nm line width. Because of the integer dose levels there are slight deviations from the 0.1 nm address grid. These deviations are indicated as "edge position error" in the upper parts of FIG. 4A and FIG. 4B, as functions of the desired line width, in 0.1 nm steps between 30.0 nm and 40.0 nm. As can be seen the deviations are within ±0.05 nm. Furthermore, the changes of edge position with 10% change of dose, as shown in the lower parts of FIG. 4A and FIG. 4B, are approx. 1 nm, varying only slightly for different line widths. In other words, since the dose is controlled in a multi-beam writer tool of the applicant to better than 1%, there is only approx. 0.1 nm change of edge position with 1% change of dose.

FIG. 5A illustrates one advantage of the multi-beam writer, namely, that the line width is virtually independent of blur variations at the 50% dose threshold. The edge positions 63 and 64 are where the zero blur intensity profile 61 crosses the "0.5" intensity level (FIG. 5A and FIG. 5B). The dose level assignments 62 are for using 20 nm beam size with 1 sigma blur of 5 nm and Quad Grid multi-beam exposure, providing a 5 nm physical grid. The intensity profiles 71, 72, and 73 are calculated with 3.5 nm, 5.0 nm, and 7.5 nm 1 sigma blur, respectively.

As outlined above, the multi-beam tool column as realized by the applicant has a very low blur of approx. 5 nm 1 sigma. Therefore, the condition that the line width is independent of blur variations holds for a large range of beam size values, including 20 nm and 10 nm beam size.

When writing a pattern on a substrate such as a 6" mask blank or silicon wafer, there are non-ideal situations which have to be taken into account during the multi-beam writing process in order to realize a mask or wafer with desired features and pattern fidelity. Possible problems to be taken into account are e.g. distortions of the substrate due to processing, distortions of the beam array field which cannot be corrected via optical deflection means, "loading effects" in a subsequent etching process, or charge induced influences. These effects can be simulated and/or measured. Corresponding data may be provided beforehand when preparing the data file for the patterns to be printed with the multi-beam writer ("data based correction"), or these effects may be calculated on basis of a model of the effect ("model based correction"). In most cases it turns out that corrections have to be done for substrate segments which are smaller than the size (area) of the beam array field, in order to meet the high demands of modern and future nanolithography technology.

FIG. 6 illustrates one example of local distortions in a target realized as a 6" photomask blank 80 consisting of a 6"×6"×1"/4 quarzglass plate 80 covered with an electrically conducting masking layer and an electron beam sensitive resist. The local distortions may be caused by pattern density variations within the mask pattern field 83 of typically 133 mm×104 mm. Within this mask pattern field there may be areas of different density of exposed spots, for instance high density 84 and low density 85 pattern areas. In addition, usually there are subfields 82 with patterns for alignment purposes. Of course, embodiments of the invention are not restricted to this type of target but can be implemented using a wide range of targets and substrate.

SUMMARY OF THE INVENTION

Certain embodiments of the invention are described in the independent claims 1 and 15. Advantageous developments and further aspects are described in the dependent claims. In detail, the method according to certain embodiments of the invention are intended to take into account a spatially dependent distortion of the target within the exposure area, with respect to dislocations transversal to the direction of the particle beam, and it comprises the steps of
(i) subdividing the exposure area into a plurality of non-overlapping sub-regions,
(ii) determining a subregion dislocation for each of said subregions, said subregion dislocation comprising a set of parameters describing (or, in other words, compensating) the distortion of the target at the location of the respective subregion,
(iii) providing the desired pattern as a graphical representation on the exposure area on the target, said graphical representation being composed of a plurality of graphical elements, each graphical element located at a respective position in the exposure area,
(iv) modifying the graphical representation in accordance with the plurality of subregion displacements, by dislocating each graphical element according to a subregion dislocation of the subregion which includes the respective position of the graphical element, obtaining a plurality of graphical elements thus dislocated, which compose a corrected graphical representation,
(v) calculating, from the corrected graphical representation, an exposure pattern defined on the multitude of pixels, said exposure pattern being suitable to create a nominal dose distribution on the target realizing contour lines representing the desired pattern.

In relation to the distortions discussed above, many embodiments of the present invention aim at correcting distortion errors primarily of short-range; that is, for the case when the dislocations induced by the distortion are not constant over the substrate area, and variations of the displacements can be neglected only within (small) regions of the substrate, i.e., subregions of the exposure area, which are preferably of a comparably small area. In particular, the area of a subregion or segment may be comparable or smaller than e.g. the area of the beam array field. A number of embodiments of the invention suggest that such distortions are taken into account in the data path of the multi-beam writer tool. More specifically, the area to be exposed is divided into a number of non-overlapping subregions, i.e., discrete segments, whose size is customizable and stands in relation to the demanded precision. For instance, in a typical realization of the invention, said area is divided into n×m segments where the area of a segment is smaller than the beam array field, e.g. into rectangular segments of 10.25 μm×10.25 μm size when using a 82 μm×82 μm beam array field. As will be discussed further below in more detail, the distortion on each segment can be predetermined up to a certain precision using state-of-the-art methods; and this allows compensation of the distortions by modifying the pattern to be exposed accordingly, for instance, by altering the shape and placement of regions of said pattern in accordance to their nominal position in relation to the segmentation of the exposure area/substrate. These modifications take place in the data path before the respective part of the pattern is projected onto the substrate. According to preferred implementations of the invention, these corrections may include scaling in both spatial directions X and Y, rotations, angle corrections and X/Y-displacement/shift corrections. Typically, the distortion correction for each segment is small in comparison to the FWHM (full width half maximum) blur of the multi-beam writer column (it is noted that the FWHM blur is equal to 2.355 times the 1 sigma blur).

BRIEF DESCRIPTION OF THE DRAWINGS

In the following, the present invention is illustrated by several embodiments described below in more detail with reference to the attached drawings. It is emphasized that the embodiments shown here are of illustrative character and are not to be construed as limit the scope of the invention. The drawings schematically show:

FIGS. 3A-3D illustrate intensity profiles of the multi-beam mask writer tool, namely, FIG. 3A shows a zero blur intensity profile for a line with 30 nm width, FIG. 3B indicates dose levels of overlapping exposure spots, FIG. 3C is a superposition of the previous two figures and FIG. 3D shows a simulated intensity profile 66 for a line of 30 nm width;

FIGS. 4A-4B show multi-beam writer intensity profiles and related data as obtained for simulations of lines with a line width of 31.4 nm (FIG. 4A) and 40.0 nm (FIG. 4B), respectively;

FIG. 11A illustrates a division of the pattern to be exposed into smaller features according to the second variant. FIG. 11B depicts the pattern after distortion correction. FIG. 11C shows a modified version where the previously divided features of the pattern are reunited.

FIG. 12A shows a pattern having a critical feature element. FIG. 12B shows the modification of segment boundaries, so the whole critical element is allocated to one segment. FIG. 14C shows the resulting situation of X/Y shifts. FIG. 14D shows the same situation of FIG. 14C in more detail and with exaggerated displacements.

FIG. 13A shows an exemplary division of the pattern into smaller features.

FIGS. 15A-E illustrate interpolating of correction parameters with the example of the X/Y-displacement vectors. FIG. 15A shows assignments of displacement vectors to nine neighboring different segments. FIGS. 15B and 15C show the same assignments separated into the X- and Y-components, respectively, for each vector and segment. FIGS. 15D and 15E show contour-line plots of interpolated values with respect to the X- and Y-components, respectively, of the relative parameter.

DETAILED DESCRIPTION

Charged-particle multi-beam tools which are suitable for implementing certain embodiments of the invention are described above with reference to FIGS. 1 to 5B. Further details about multi-beam charged-particle multi-beam tools can be found in U.S. Pat. No. 6,768,125, EP 2 187 427 A1 and EP 2 363 875 A1 and references cited therein, which are all herewith included by reference as part of the disclosure.

Figure 7:
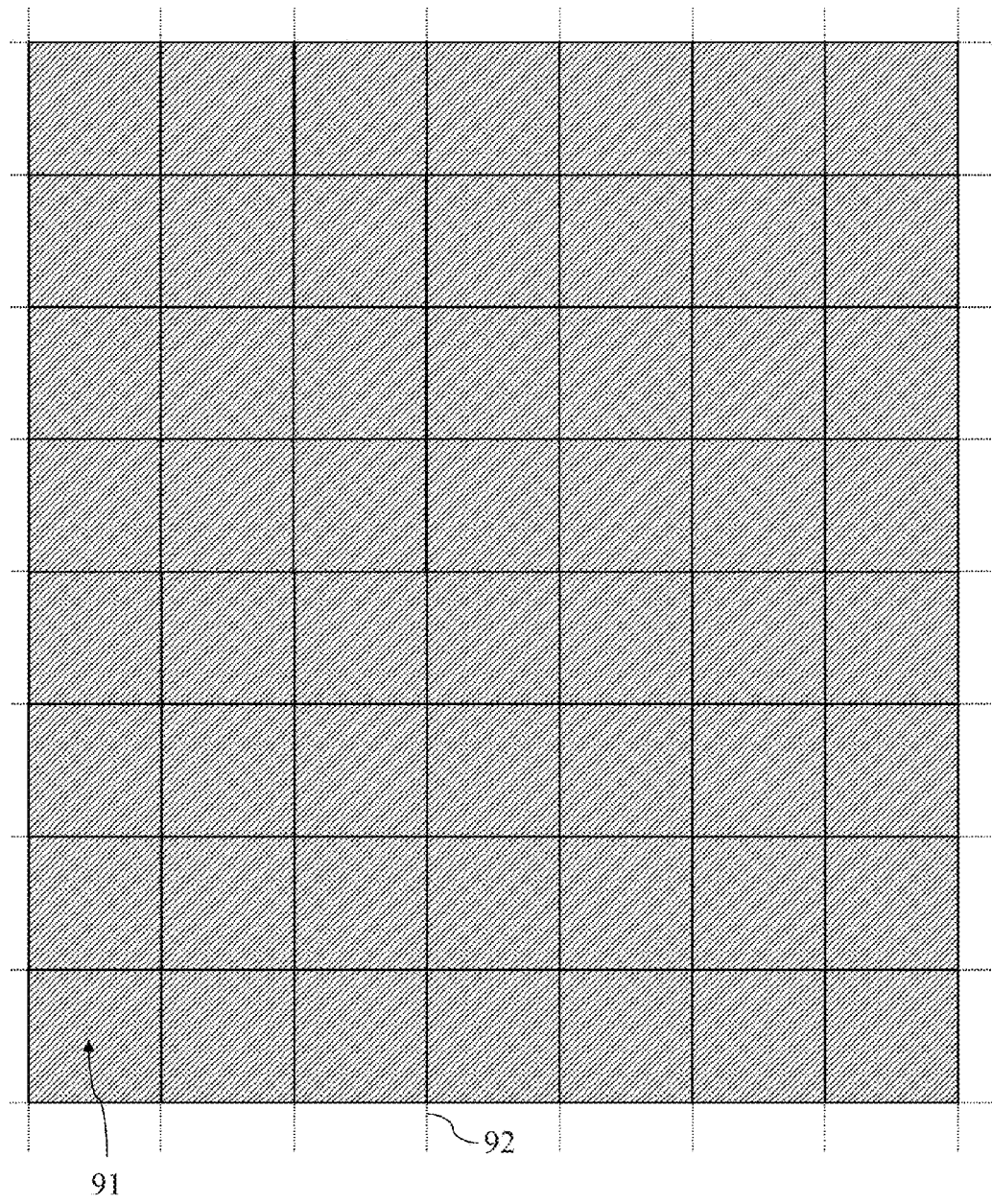
FIG. 7 shows a segmentation of an exposure area, assuming zero deviation of the X/Y positions of the segments.

According to many embodiments of the invention, the exposure area is divided into a plurality of discrete subregions, hereinafter mostly referred to as "segments". FIG. 7 shows one example of an exposure area (shown is a part of the area of the substrate pattern field) segmented into segments 91, with respect to an ideal zero deviation of the X/Y positions of segments. The segmentation may, but need not, be a regular grid and/or correspond to a grid aligned along the mathematical grid 92. Preferably, the subregions may be realized as rectangular or quadratic segments 91. It should be noted that many embodiments of the present invention include all finite-element-coverings of said area. Here, the size (or, area) of the segments (which generally is inversely proportional to their number) is related to the available computational power (speed of the datapath) and demanded precision. Apart from this limitation, the segmentation is chosen freely; ideally, however, appropriately with respect the given distortions. In a typical realization of the invention, the computational power should allow for a maximal segment size which is smaller than the beam array field of the multi-beam writer. For instance, for a mask field of 132 mm×104 mm to be exposed with a multi-beam writer possessing a 82 μm×82 μm beam array field with 512×512=262,144 beamlets, the available computational power of a realistic implementation will allow for a division into segments of approximately 10.25 μm×10.25 μm.

Figure 8A:
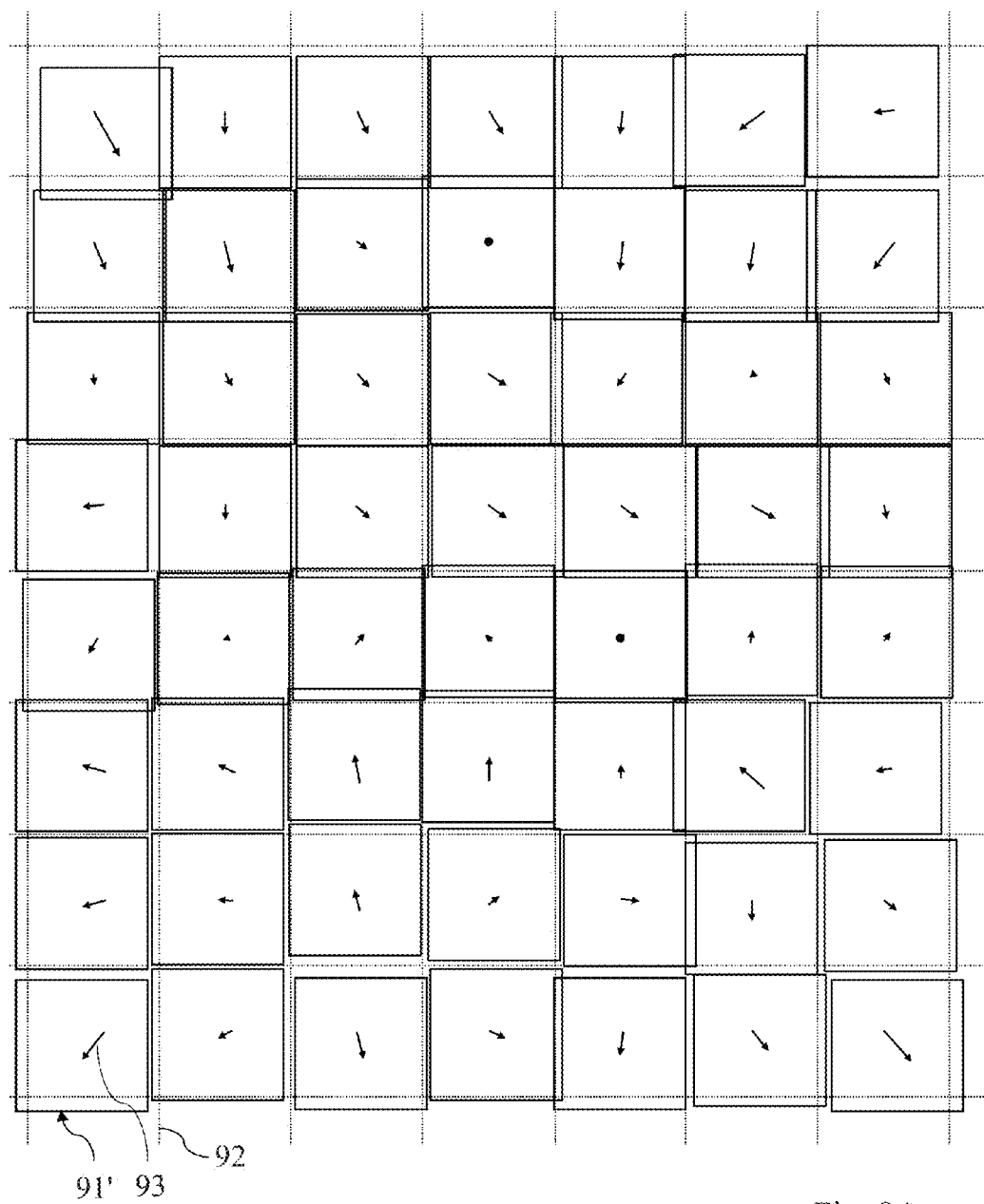
FIG. 8A shows an example where the segments are assigned distortion corrections, indicated by displacement vectors.
Figure 8B:
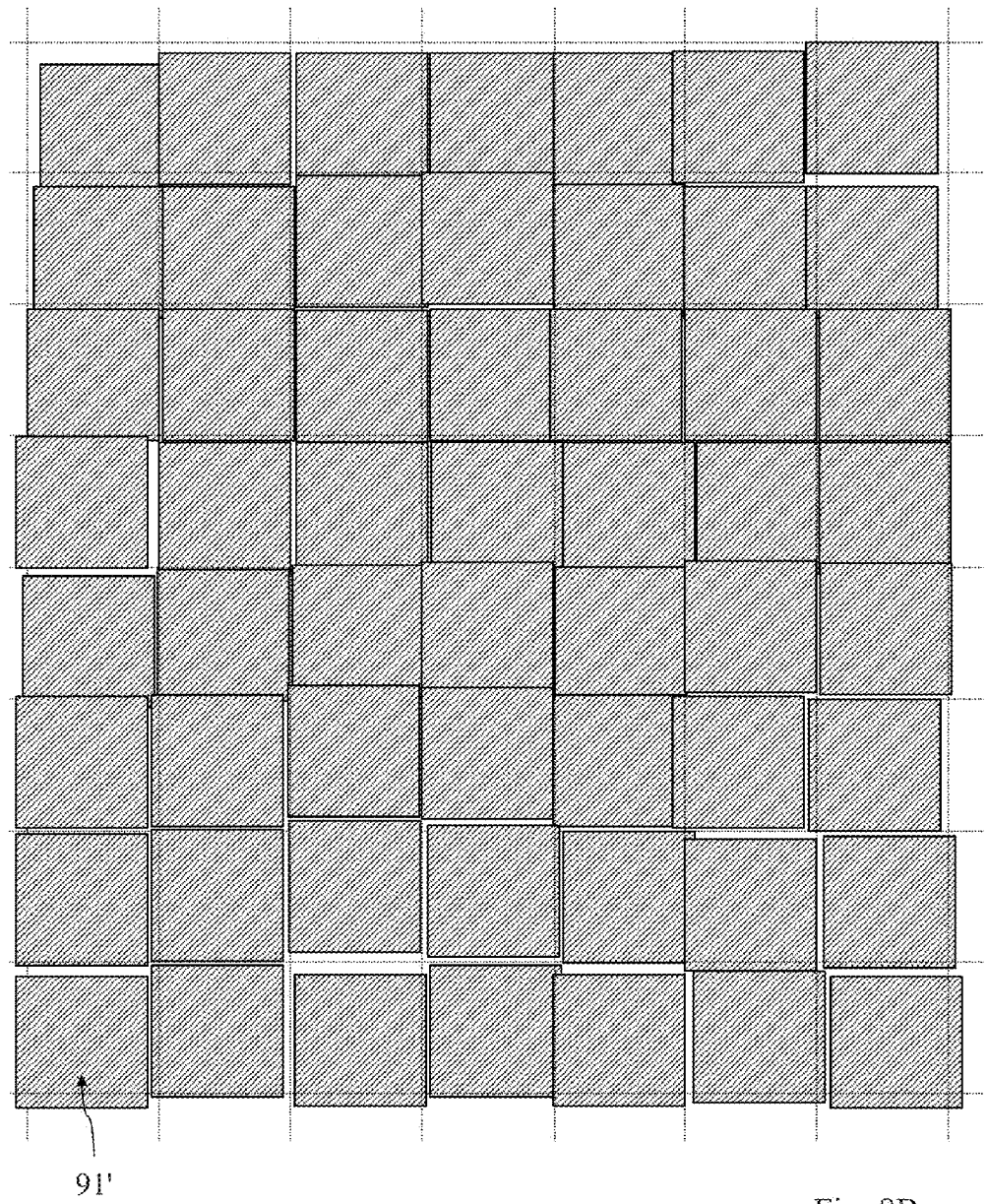
FIG. 8B illustrates the distortion corrections as displaced segments.

Each of said segments is assigned an individual distortion-correction, which is obtained from model-based and/or measurement-based analyses of the distortions affecting the multi-beam writer tool and specifically the target. Primarily, these corrections concern placement corrections. FIG. 8A shows an example of an assignment of placement correction vectors to the segmentation of FIG. 7, resulting in shift corrections as illustrated in FIG. 8B. In this example, all segments 91' have an X/Y shift with respect to the mathematical grid 92 (with the exception of two segments where the X/Y shift is zero), visualized in FIG. 8A with arrows 93 indicating the direction and symbolizing the amount of the segment area shifts, and in FIG. 8B as hatched segments 91'. Note that these shifts are depicted exaggerated for sake of clarity. In order to allow for higher-order corrections, each of the segments can also be assigned further correction-factors. In many embodiments of the invention and depicted in FIG. 8C, these corrections may, for instance, include a rotation R01 around a reference point, scaling in X-direction SX01, scaling in Y-direction SY01 and an angle-correction A01, besides the mentioned shift D01 along X and/or Y directions. Each set of parameters describing a correction of a segment is also called a "dislocation" 93' in the context of the present application. FIG. 8D illustrates the influences on the segments in such a scenario with dislocations according to multiple types of corrections of FIG. 8C. Note that due to angle-correction a rectangular segment may become an arbitrary parallelogram 91". Note further that for the sake of simplicity, all of the following drawings only contain X/Y-placement corrections. However, embodiments of the invention are not limited to this single correction type.

Figure 9:
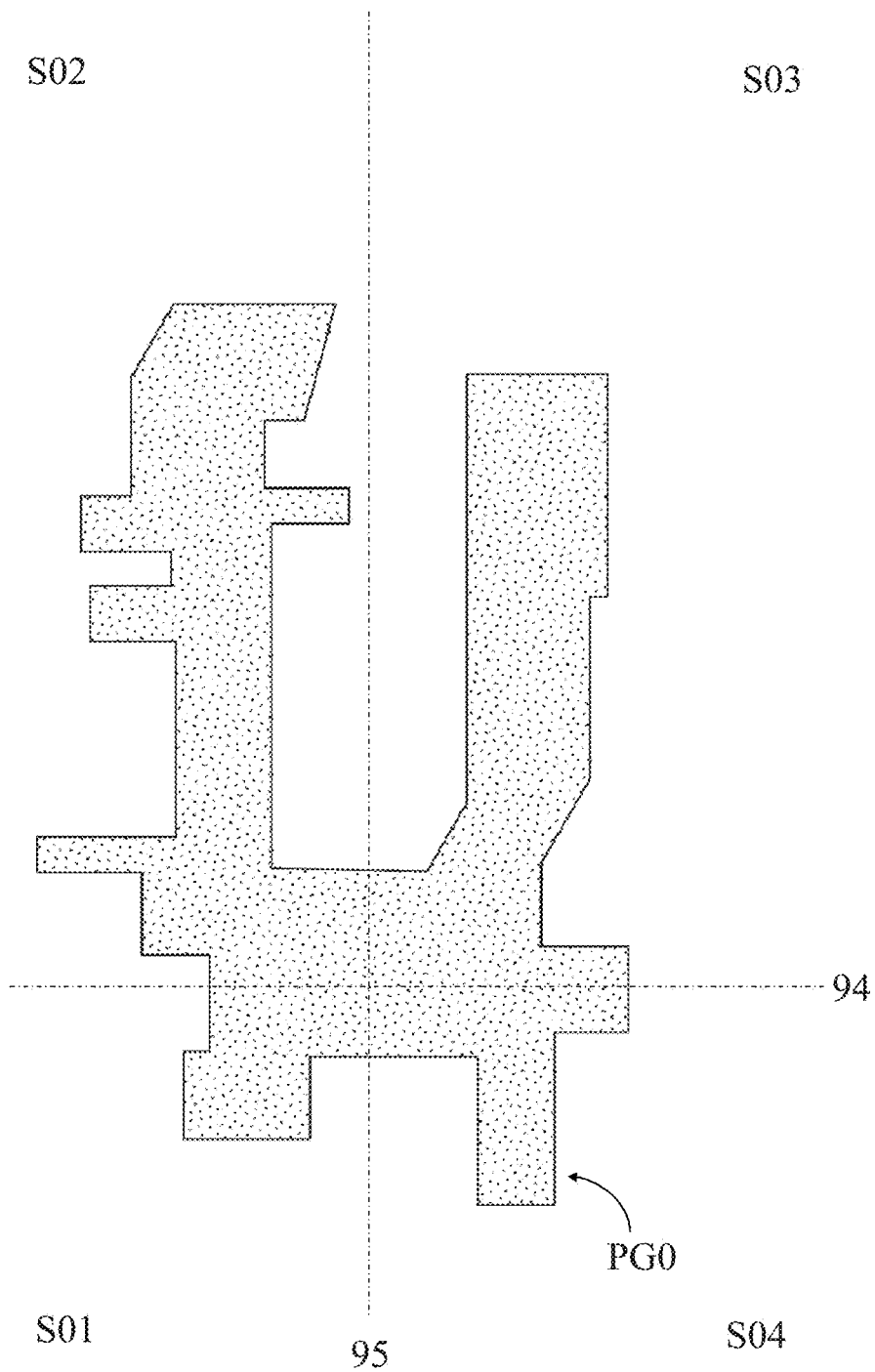
FIG. 9 shows an example of a pattern to be exposed being intersected by the segmentation boundaries of four segments.
Figure 10:
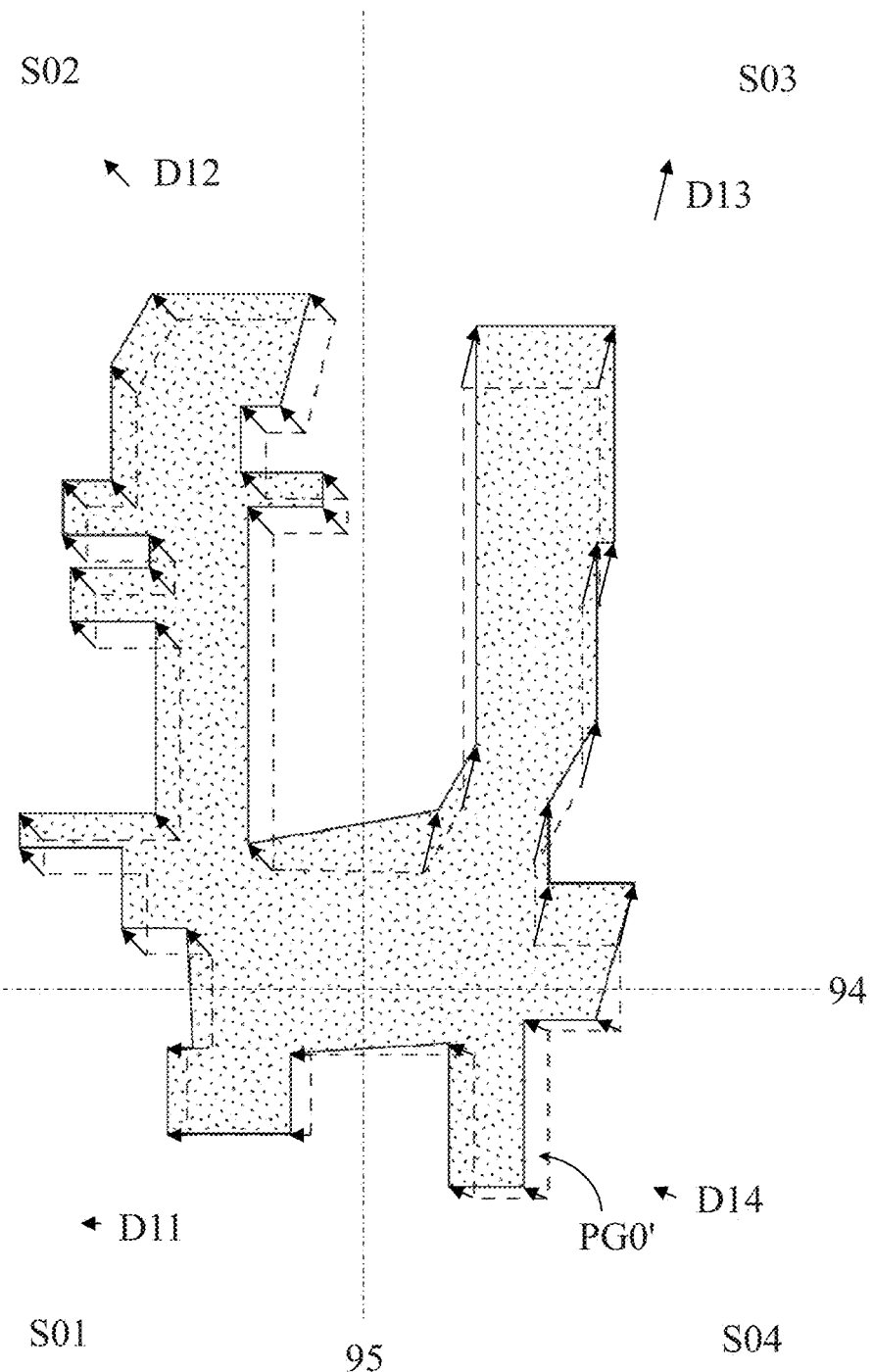
FIG. 10 shows the pattern of FIG. 9 after distortion correction according to a first variant of the invention.
Figure 11A:
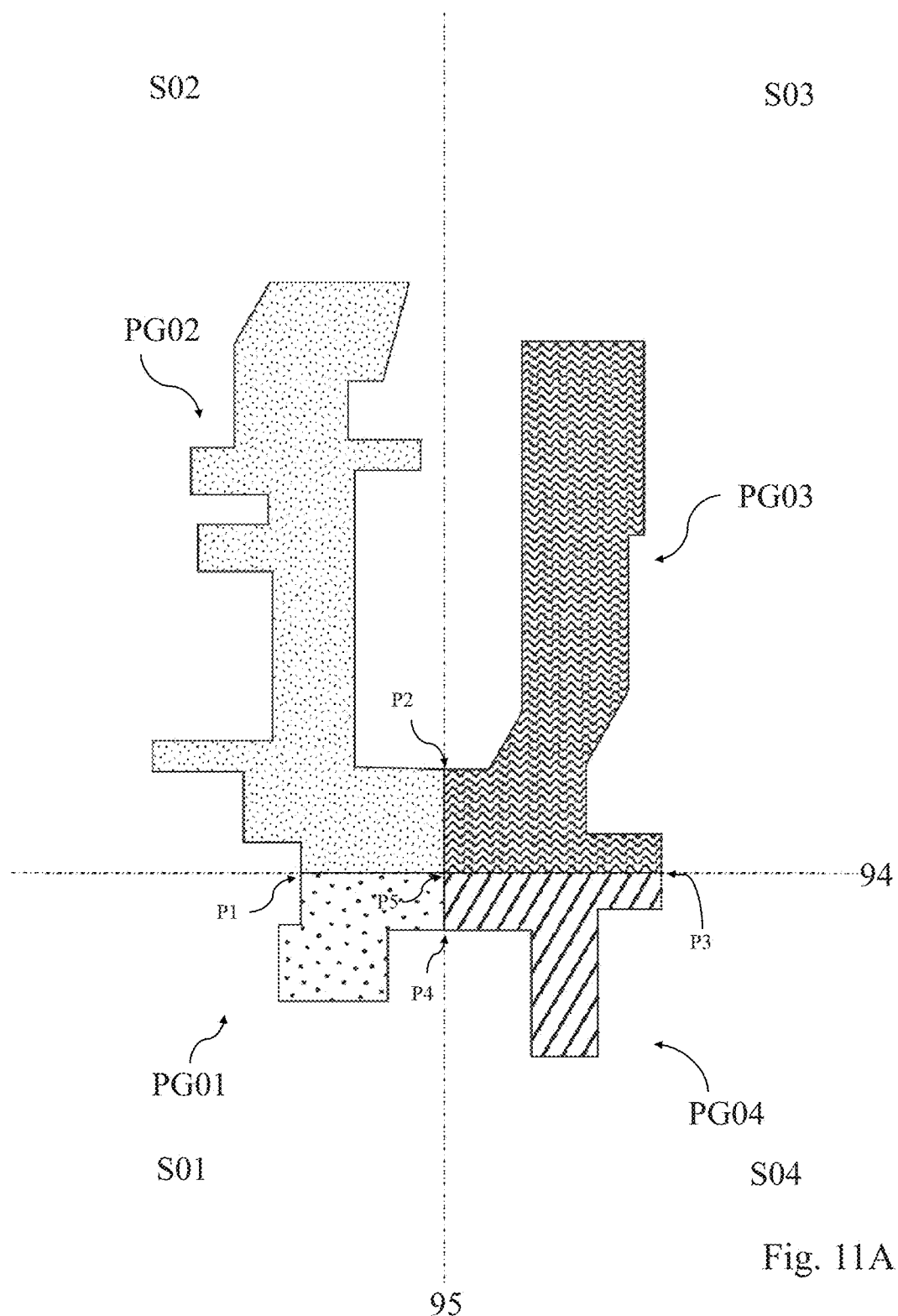
FIGS. 11A-C illustrate the distortion correction according to a second variant of the invention.
Figure 11B:
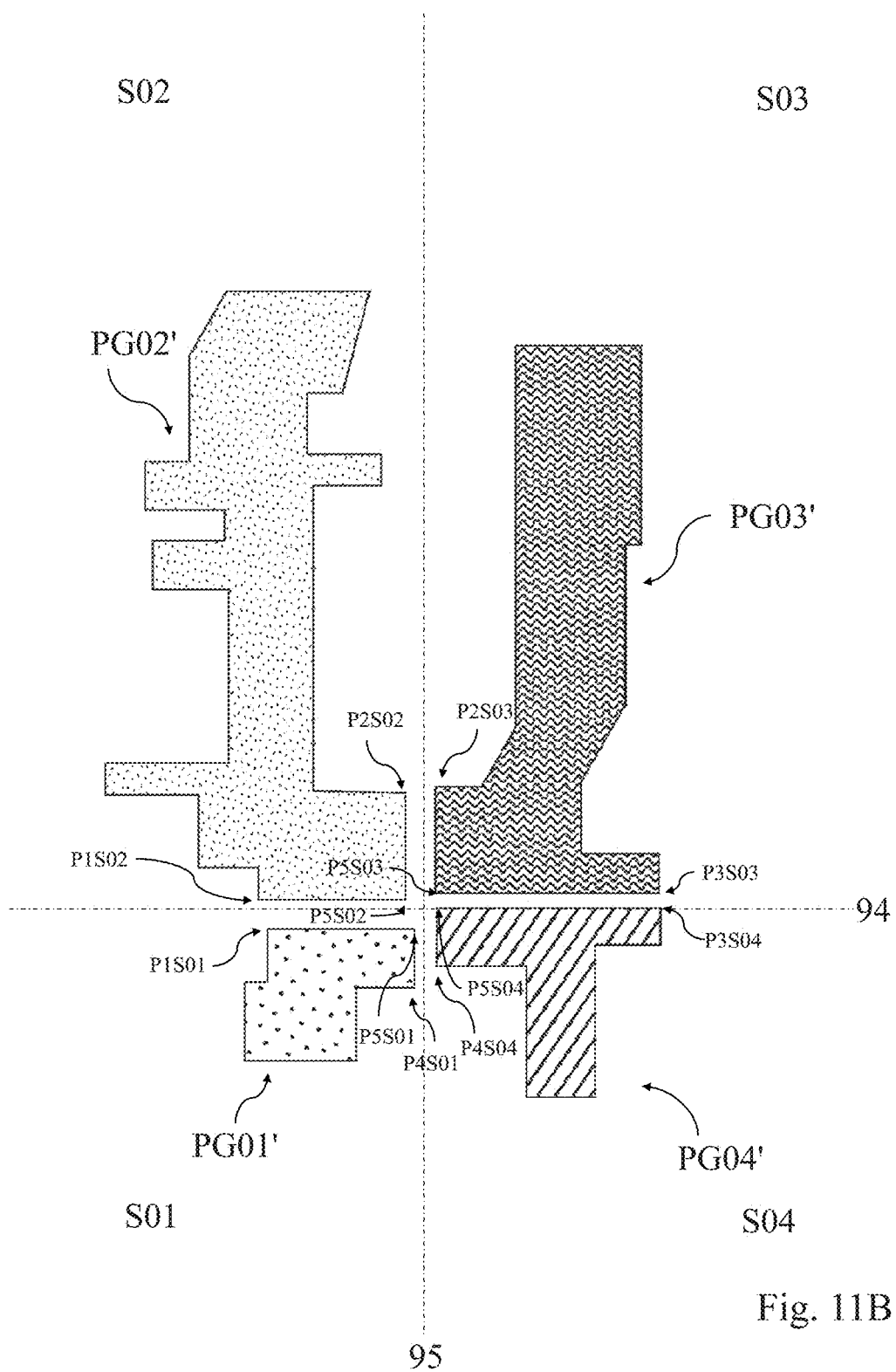

As one important aspect of certain embodiments of the invention, the pattern to be exposed is considered for distortion correction. This concerns the way how the corrections assigned to each of the segments, is incorporated in said pattern which is composed of a plurality of graphical elements (e.g., polygons in case of a vector graphics, or pixels in case of a raster graphics). Preferred embodiments of the invention include the following schemes:

a) In a usual application, the pattern to be exposed is given as a polygon, like the polygon PG0 shown in FIG. 9. (In general, a pattern will comprise a plurality of polygons and possibly other structures, such as circular dots, etc.) Here, the lines 94, 95 denote boundaries between the segments S01, S02, S03, S04. FIG. 10 shows how the polygon PG0 will look after distortion correction according to this first variant. The vectors D11, D12, D13, D14 in FIG. 9A are vectors corresponding to displacement/shift corrections assigned to the segments S01, S02, S03, S04. According to one embodiment of the invention, each of the coordinates of the vertices defining the polygon is corrected according to the segment in which it lies. For instance, in FIG. 10 all vertices of the original polygon (depicted in dashed lines) in the upper right segment S03 are collectively shifted by the vector D13. In the more general case of corrections beyond shifts (rotation, X/Y-scaling and angle-correction) all vertex coordinates within one segment are transformed according to the correction that has been assigned to this particular segment.

b) According to a second variant of the invention, the pattern to be exposed is divided into segments at segment borders identical to the boundaries 94, 95 of the segmentation of the exposure area and corrected accordingly. As an illustrating example, FIG. 11A shows how the pattern to be exposed of FIG. 9, represented by polygon PG0, is divided by segment lines 94, 95 into four polygons PG01, PG02, PG03, PG04. The points where the polygons PG01, PG02, PG03 and PG04 meet at the segment boundaries 94, 95 are indicated as "border points" P1, P2, P3, P4 and P5 in FIG. 11A. FIG. 11B illustrates the situation after corrections of the segment X/Y positions. It can be seen that the polygons PG01', PG02', PG03' and PG04' have new positions according to the individual distortion correction of each segment. It should be noted that instead of the border points P1, P2, P3, P4, P5 there are now 12 new border points P1S01, P1S02, P2S02, P2S03, P3S03, P3S04, P4S04, P4S01, P5S01, P5S02, P5S03, and P5S04. Furthermore, each of the polygons PG01, PG02, PG03, PG04 may also be rotated, resealed and angle-corrected (not shown in FIG. 11B) according to the correction assignment of the segments.

Figure 11C:
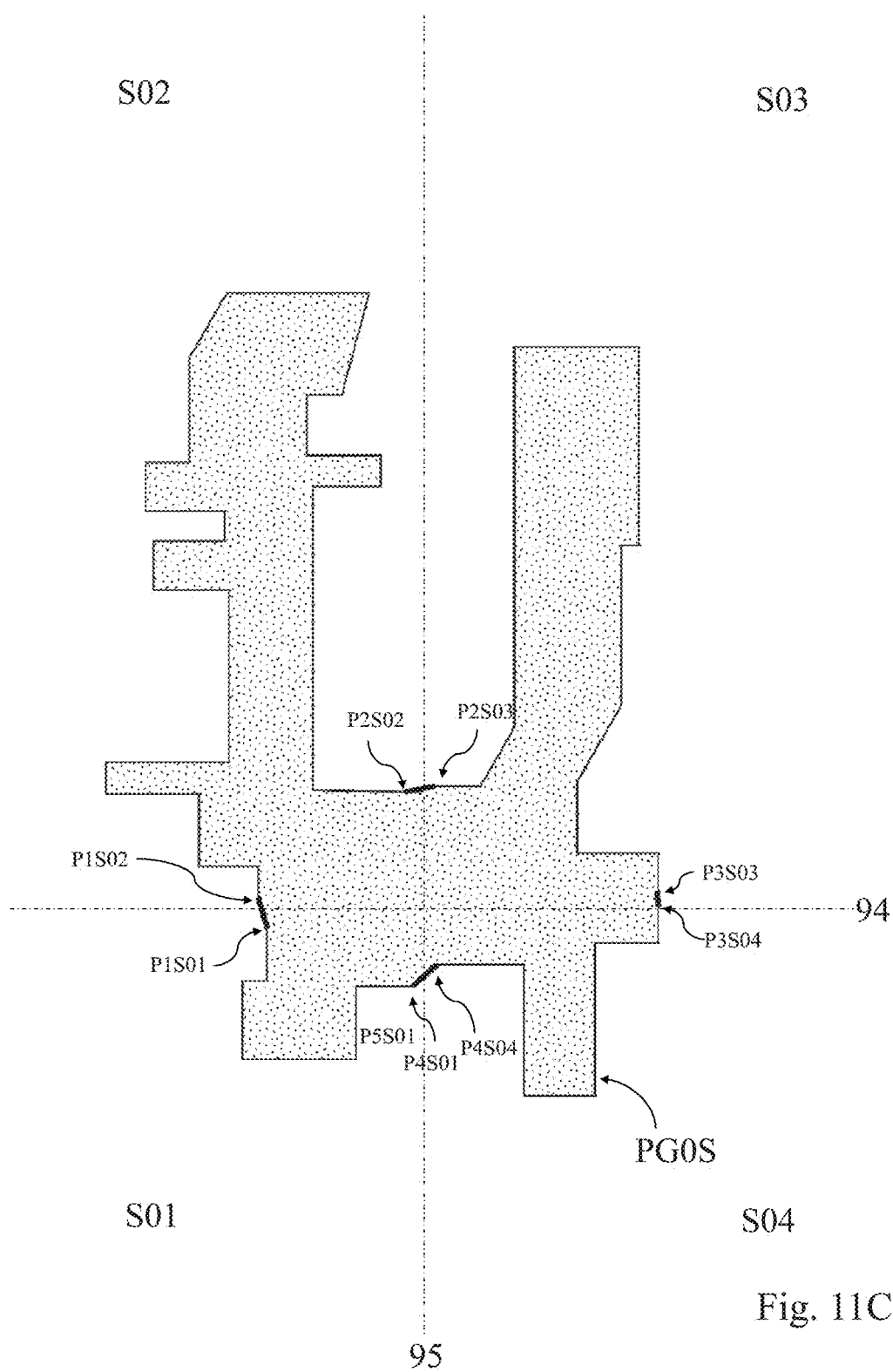

In a modified version of variant b), the new border points, in the example P1S01, P1S02, P2S02, P2S03, P3S03, P3S04, P4S04, P4S01, P5S01, P5S02, P5S03, and P5S04, which are a consequence of the segmentation, may also be used to reunify the pattern to be exposed. This optional version of variant b) is visualized in FIG. 11C, where and connections (thick lines FIG. 11C) between the pairs P1S01-P1S02, P2S02-P2S03, P3S03-P3S04, and P4S04-P4S01 enable a reunion of the polygons PG01, PG02, PG03, PG04 (which were separated due to segmentation) into a single polygon PG0S; and the points P5S01, P5S02, P5S03, and P5S04, which are in the interior of the reunified polygon, vanish.

Figure 12A:
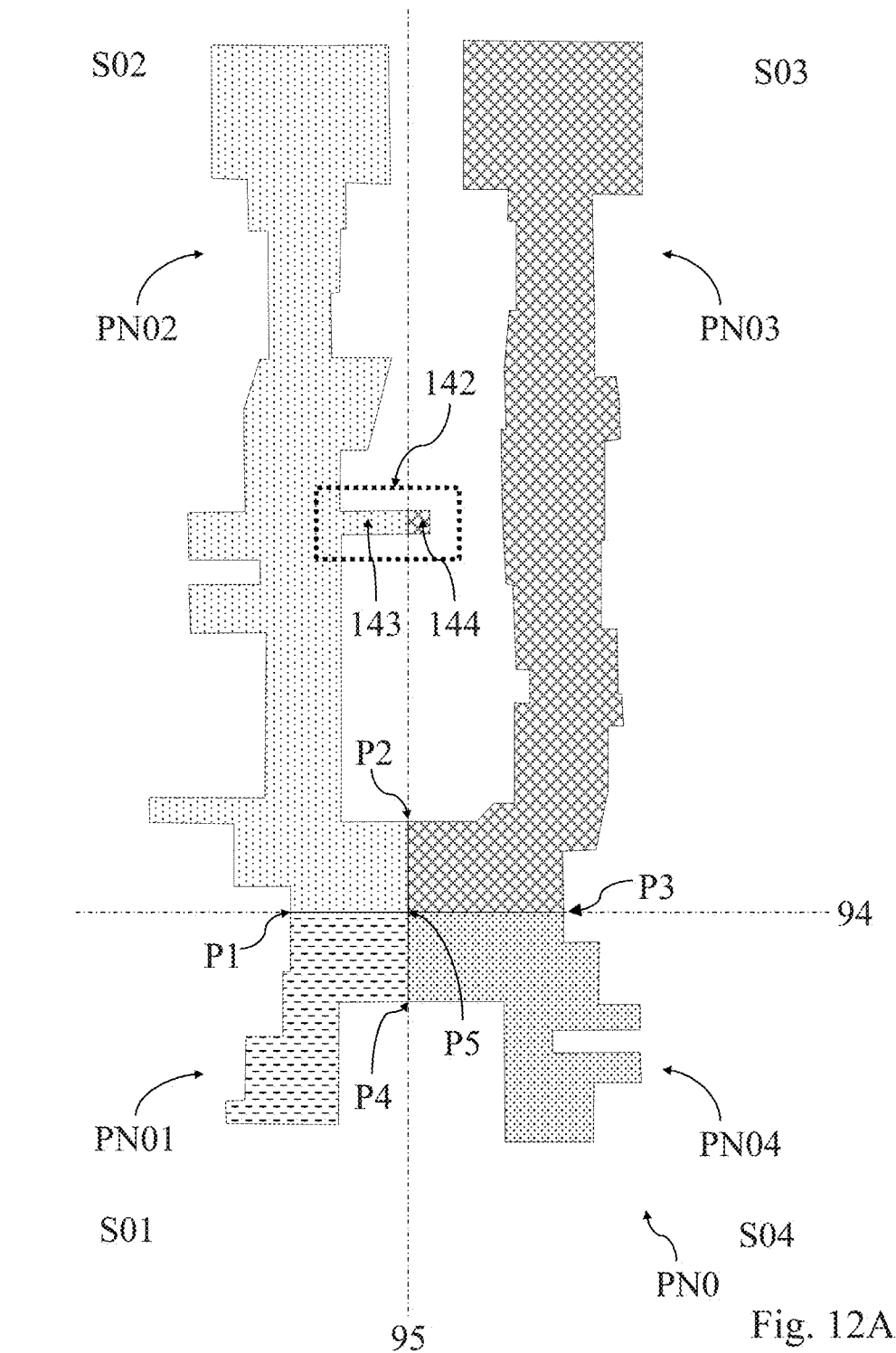
FIGS. 12A-D illustrate treatment of critical features crossing a segment boundary.
Figure 12B:
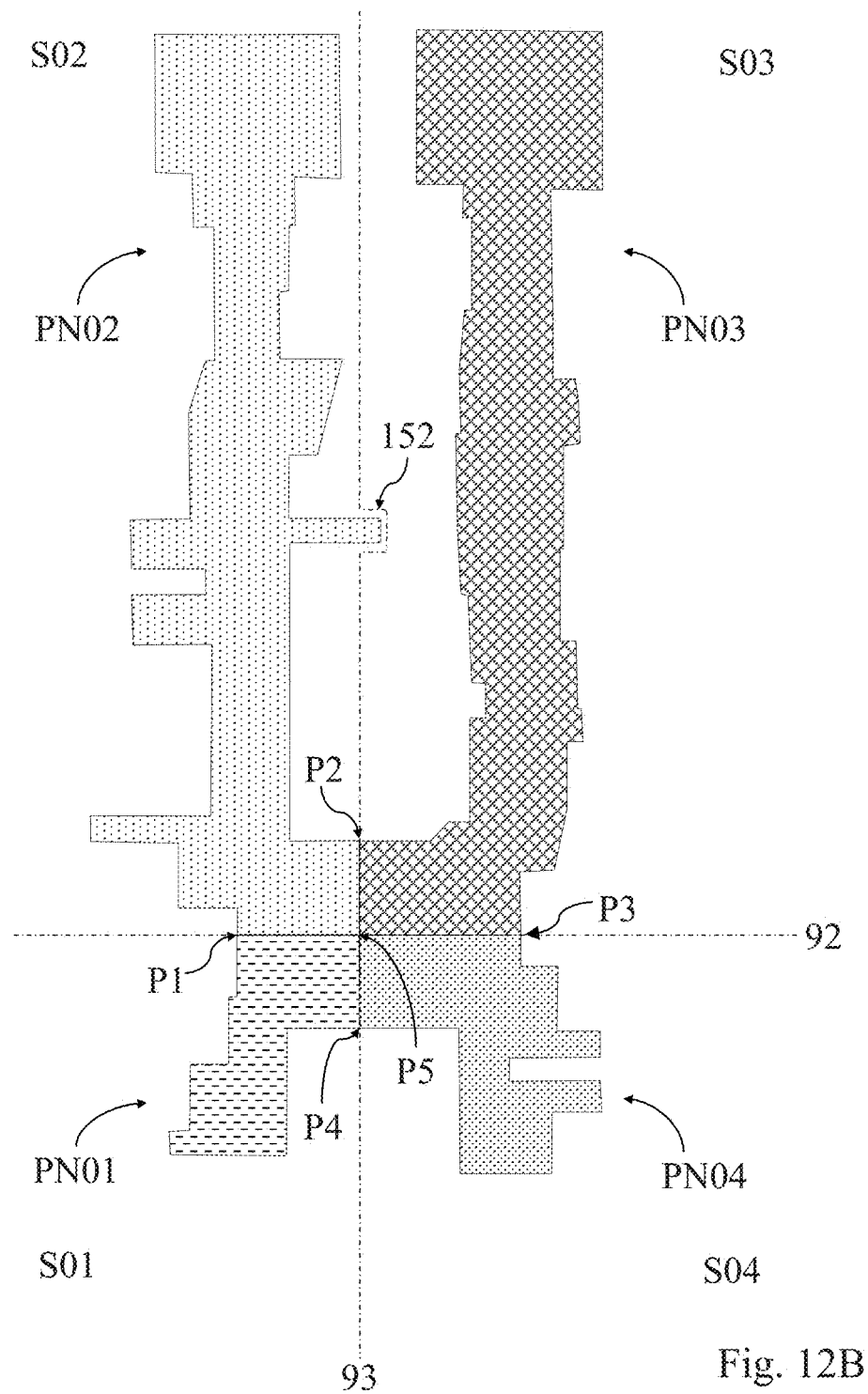
Figure 12C:
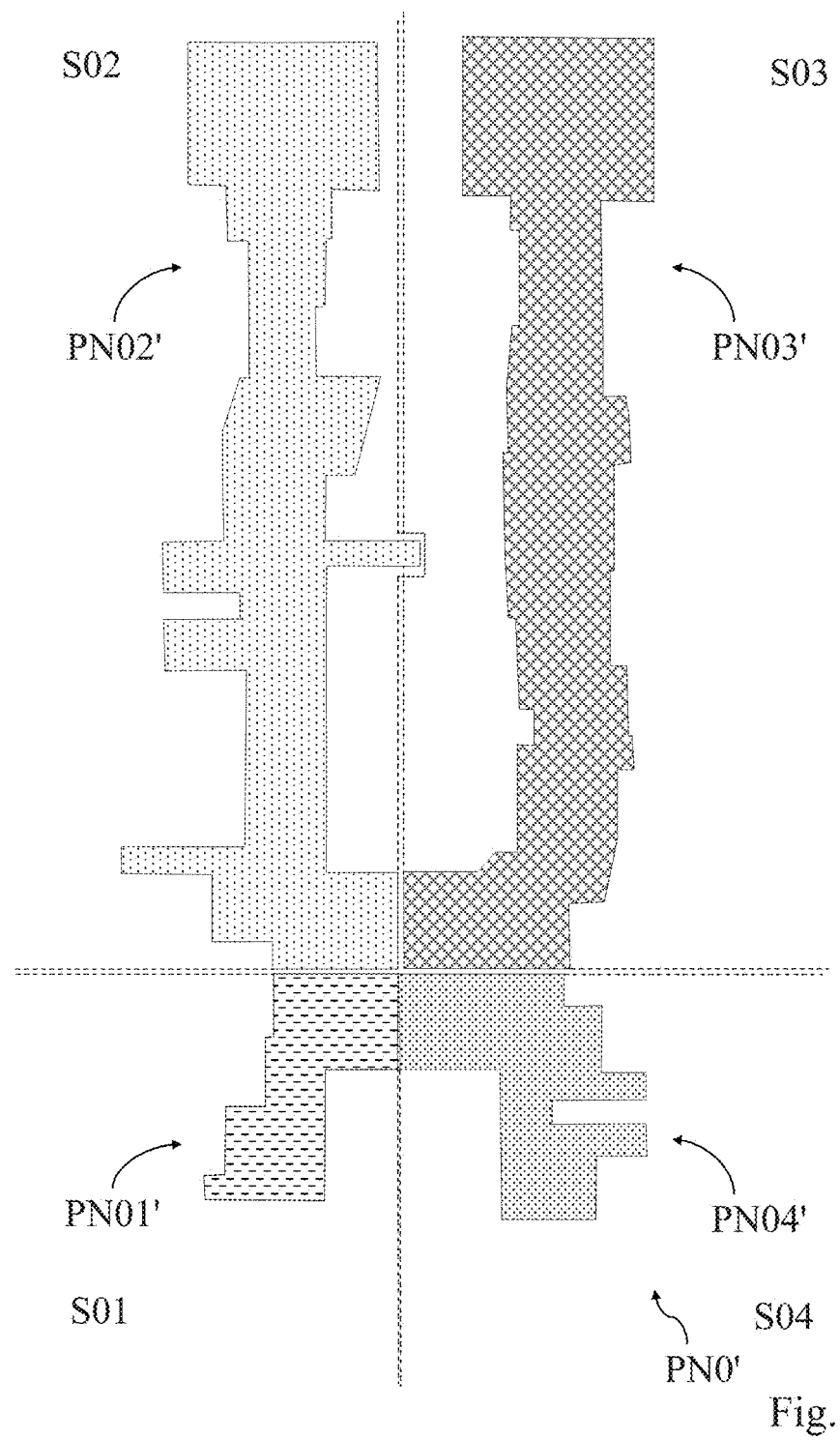
Figure 12D:
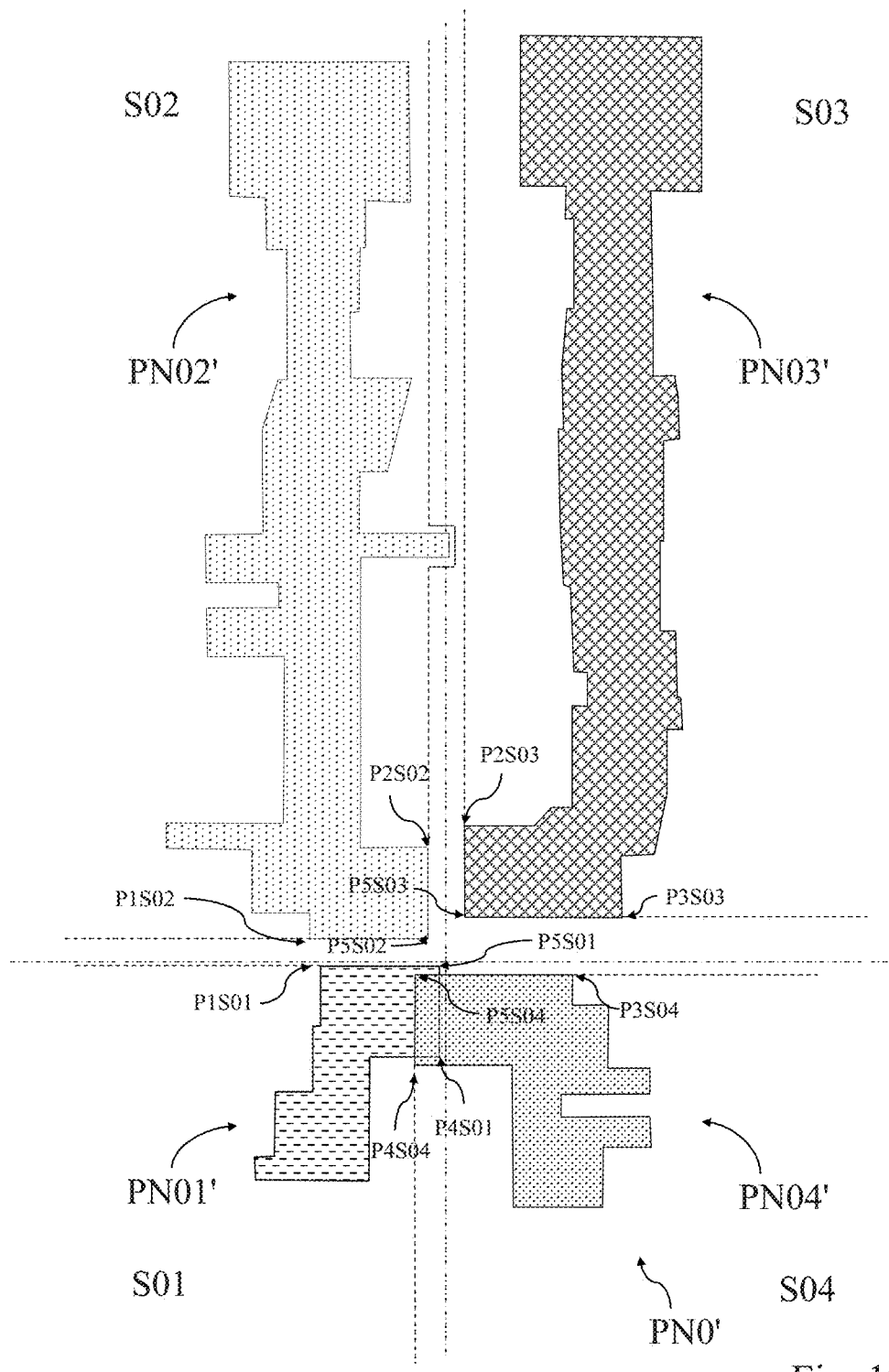

For a further optional version of variant b), it is important to note that the boundaries of the segments may be adapted in order to avoid the segmentation of critical features. As an example FIG. 12A shows a pattern PN0 with a critical feature 142 of such length that the feature extends beyond the segment boundary. Thus, part 143 of the critical feature would belong to the segment with the main part of pattern PN02, whereas the part 144 of the critical feature 142 would belong to part PN03 in the neighboring segment S03. In order to avoid the segmentation of such a critical feature there is an automatic feature of the datapath algorithm indicating a critical area between segment boundaries. There is then the decision to allocate the critical feature 152 as a whole to one segment only, in this case segment S02, so the critical feature remains part of feature PN02, PN02'. The result of this procedure is given in FIG. 12B where the pattern PN02 is generated including the critical feature. In other words, the segment boundary is altered at the region of the critical feature 152. FIG. 12C shows the situation PN0' after applying a displacement/shift correction. The same is shown in FIG. 12D in more detail, where the coordinate displacements are exaggerated for clarity.

c) According to a third variant, the pattern to be exposed may be divided into a plurality of smaller features (typically but not necessarily polygons) independently from the segmentation of the exposure area. An arbitrary but reasonable reference point of each feature is used to assign each of them to one of the exposure area segments. A reasonable reference point is typically the center-of-mass, or the center of a bounding box enclosing each feature. Subsequently, each feature is distortion corrected according to its segment assignment.

As for the segmentation of the exposure area, the division of the pattern to be exposed into smaller features can be chosen freely. In a preferred embodiment of the invention there is the option to state a maximal size of the features. Typically, said maximal feature size is chosen small in relation to the segmentation of the exposure area.

Figure 13A:
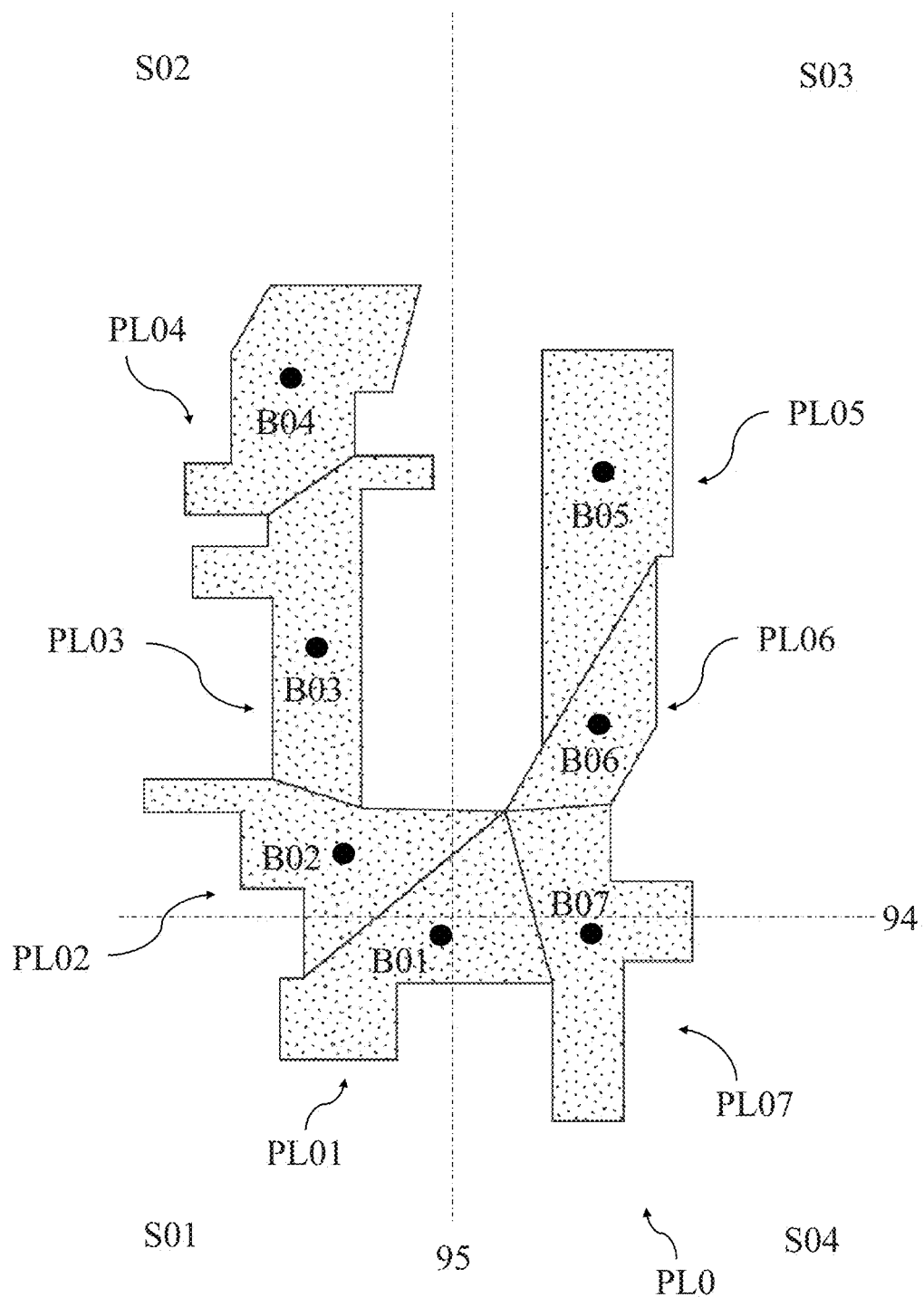
FIGS. 13A+B illustrate distortion correction according to a third variant.
Figure 13B:
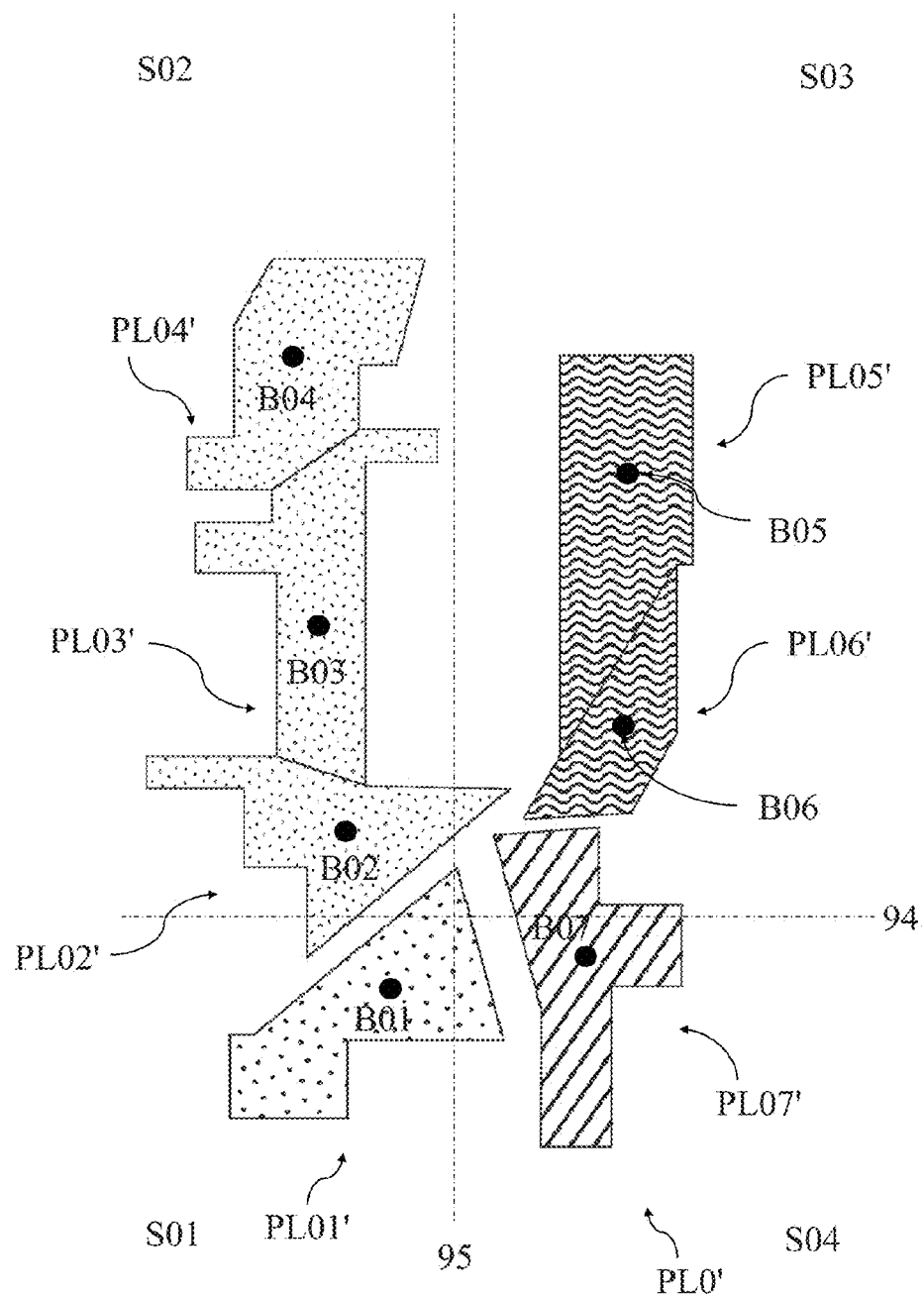
FIG. 13B depicts the pattern after distortion correction.

FIG. 13A and FIG. 13B illustrate an example of variant c). FIG. 13A shows that the exposure pattern of FIG. 9 is divided into a plurality of polygons PL0, composed of smaller features (polygon portions) PL01, . . . , PL07, irrespective of the boundaries 94, 95 of the segments S01, S02, S03 and S04. Each of the polygon portions PL01 . . . PL07 is assigned a reference point denoted by a B01, . . . , B07. In a preferred embodiment of the invention, these reference points are chosen to be the center of masses of the portions PL01 . . . PL07, or the center of a rectangular bounding box minimally surrounding the respective portion (i.e., the center of the rectangular hull along X- and Y-directions). The distortion correction is then applied to each feature according to in which segment its reference point lies. For example, FIG. 13B illustrates that in the resulting structure PL0' comprising new portions PL01' . . . PL07', the polygon portions PL02', PL03' and PL04' are still connected as their reference points B02, B03 and B04 lie in the same segment S02 and, consequently, are shifted in the same way; whereas other portions are shifted with respect to each others: for instance, portion PL01' is separated from portion PL02' after distortion correction, since reference point B01 lies in segment S01 whose assigned X/Y-placement-correction differs from the X/Y-placement-correction of segment S02.

Figure 8C:
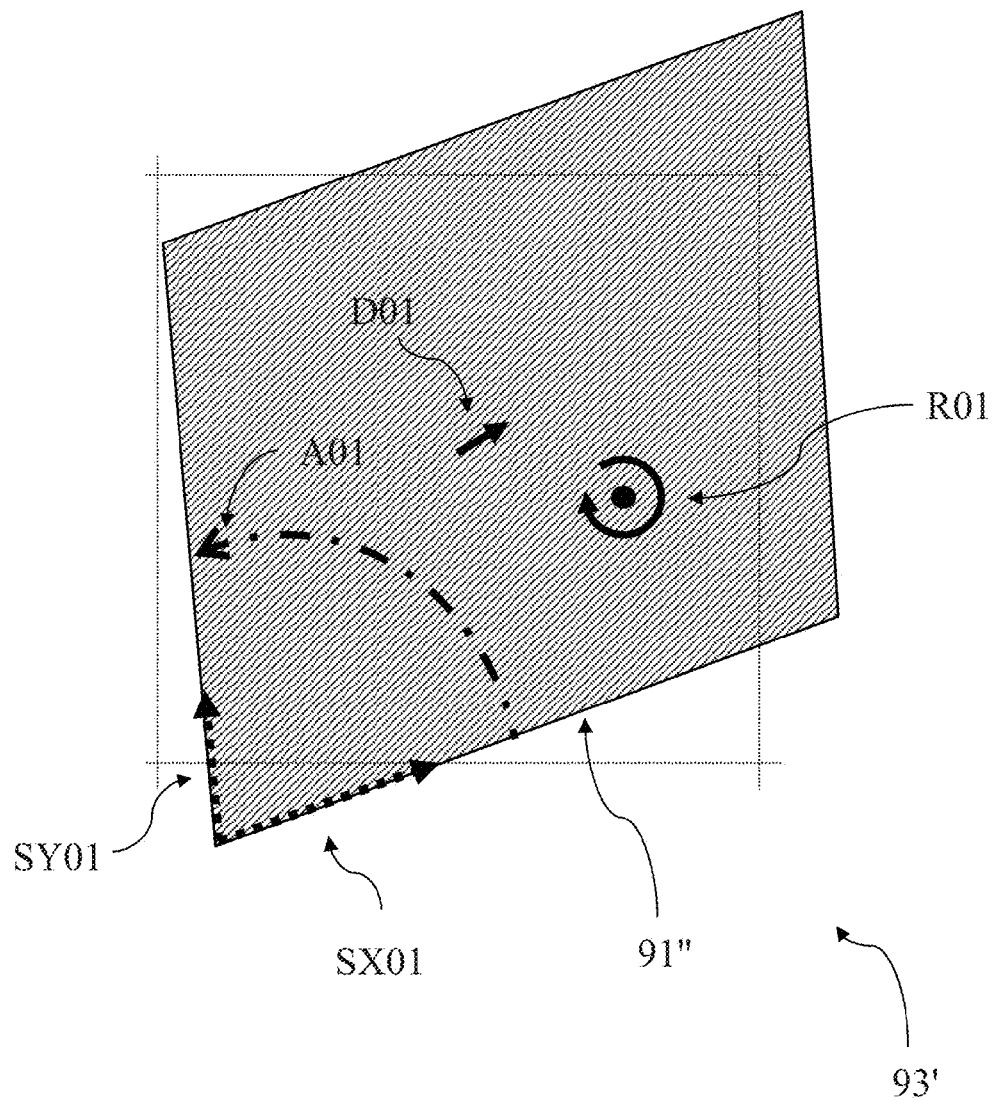
FIG. 8C shows a general assignment of distortion corrections of a single segment.
Figure 8D:
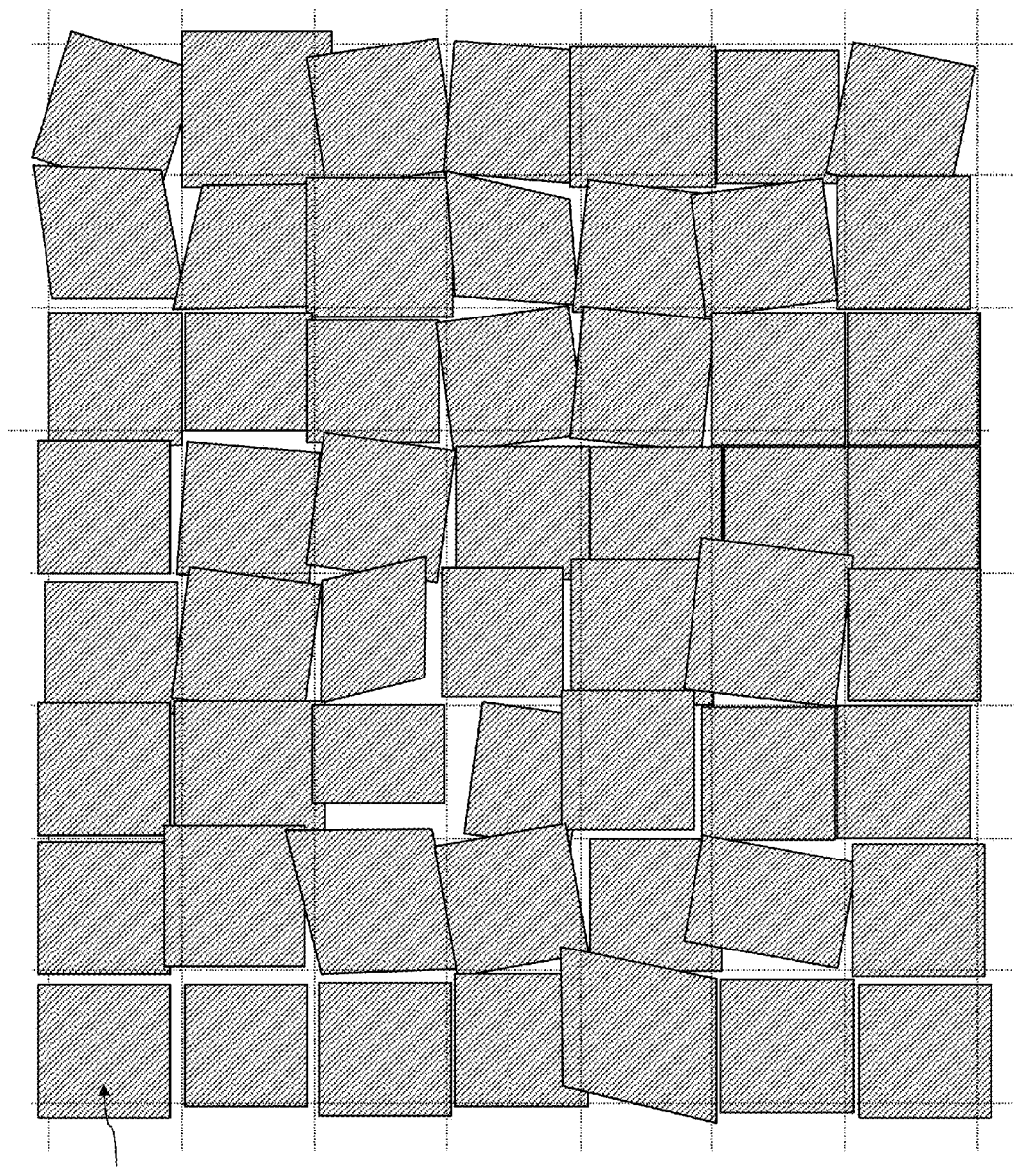
FIG. 8D shows an example of a general distortion correction including correction types shown in FIG. 8C affecting the exposure area from FIG. 7.

Variants a) and c) also allow for applying 2D multivariate interpolation of the distortion correction factors, such as factors D01, R01, SX01, SY01, A01 illustrated in FIG. 8C, with respect to the center of the segments covering the exposure area. In particular, according to this embodiment of the invention, in variant a) each of the coordinates of the vertices defining the polygon is corrected according to the 2-dimensionally interpolated value (for example, via bilinear interpolation, bicubic interpolation, or spline interpolation). In variant c), every feature is distortion corrected according to the interpolated value at its reference point.

Figure 15A:
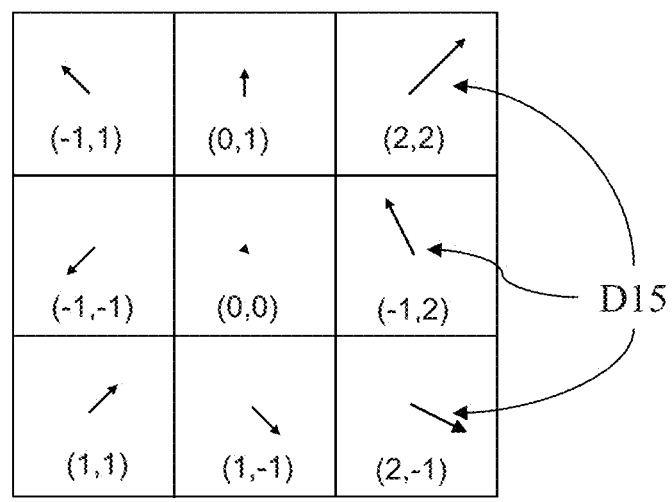

FIGS. 15A-E show an example of the interpolation of the X/Y-displacement vectors D15 between nine neighboring segments. FIG. 15A shows the originally assigned 2D-displacement vectors. In FIGS. 15B and 15C these displacement vectors are divided into their respective X- and Y-components for each segment, denoted by D15-X and D15-Y. FIG. 15D shows a contour-line plot of interpolated values D15'-X with respect to the X-components of these vectors, and FIG. 15E shows a contour-line plot of interpolated values D15'-Y with respect to the Y-components of these vectors. Hence, in total this interpolation yields a continuous function of displacement vectors defined by the components D15'-X and D15'-Y.

Multi-Beam System Datapath with Short-Range Distortion Correction

Figure 14A:
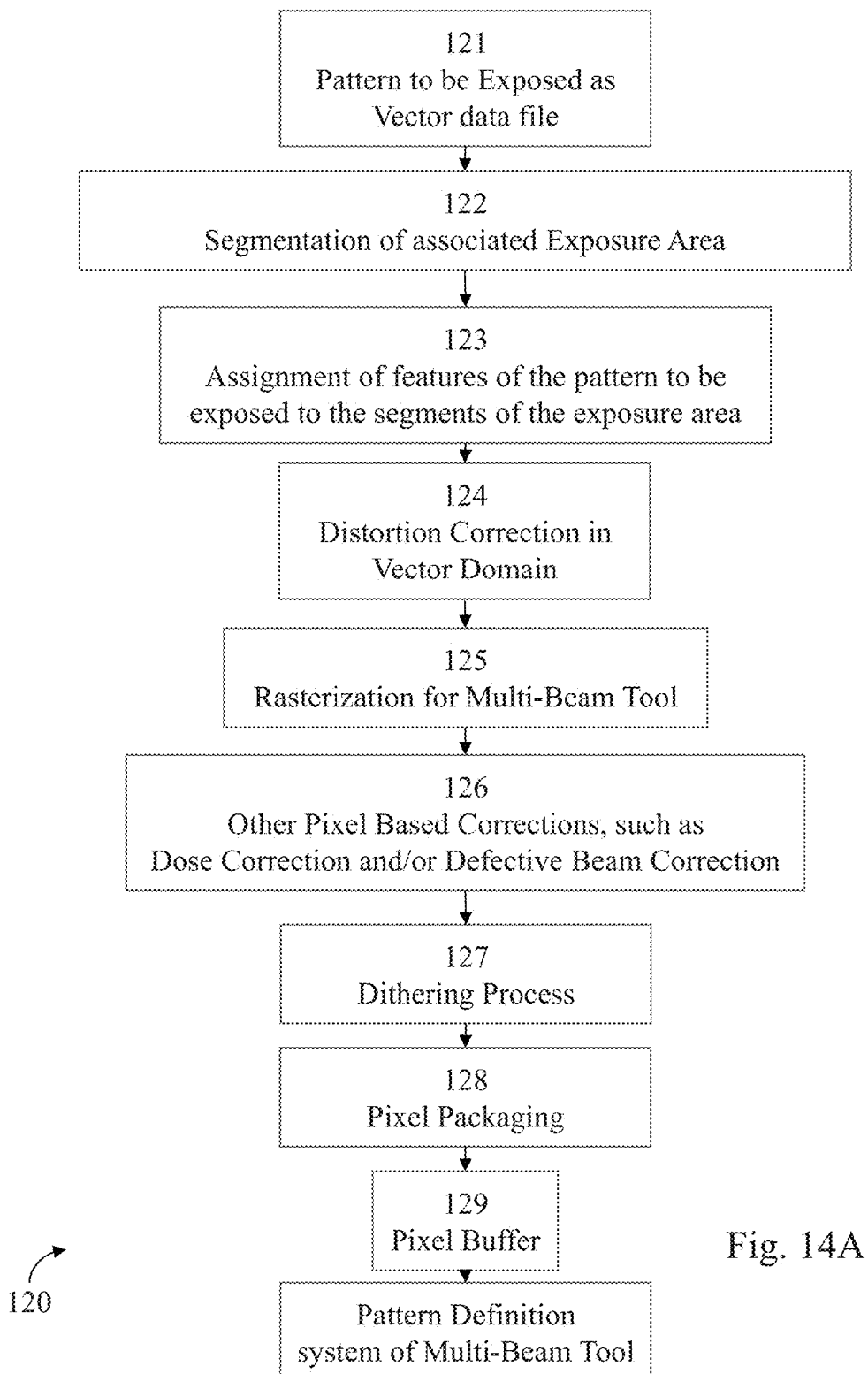
FIG. 14A shows a data path flow wherein the corrected vector data file is generated prior to rasterization.
Figure 14B:
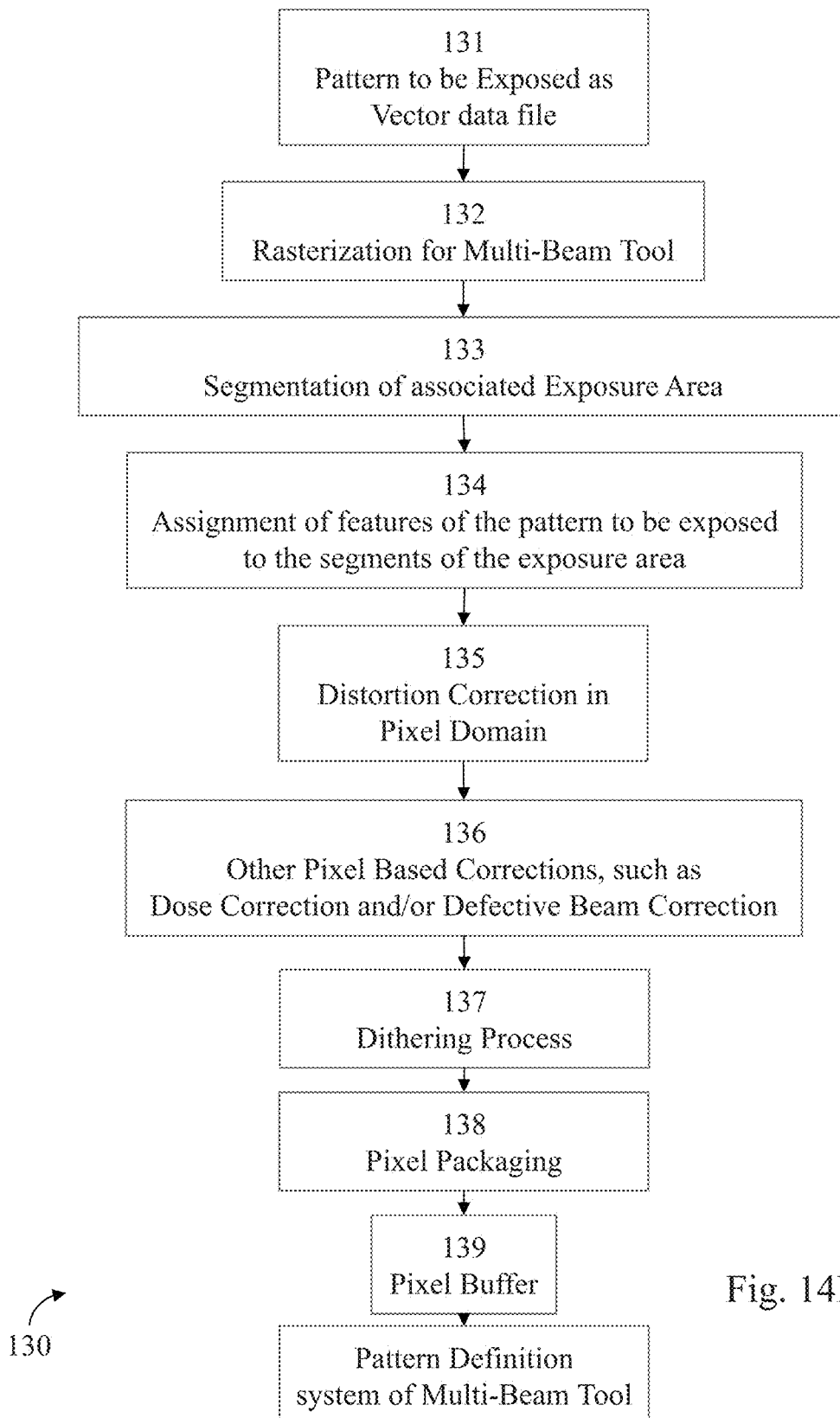
FIG. 14B shows another data path flow wherein the corrected pixel data file is generated after rasterization.

FIGS. 14A and 14B illustrate how the above distortion corrections are incorporated in the datapath flow, in two respective variant processes.

The complete pattern image comprises a vast amount of image data, which is why for efficient processing of this data a high-speed datapath is needed that generates the pixel data to be exposed, preferably in real-time. The pattern to be exposed is typically described in a vector format, e.g. as a collection of geometries like rectangles, trapezoids or general polygons, which typically offers better data compaction and therefore reduces the requirements on data storage. The datapath comprises three major parts:

1) a distortion correction processing unit, which may implement one of above variants a), b) or c)
2) a rasterization process to translate the vector to pixel data, and
3) a buffer to temporarily store the pixel data for the writing process.

The distortion correction according to several embodiments of the invention can be done either prior to rasterization (FIG. 14A), or after rasterization (FIG. 14B).

FIG. 14A shows a flowchart 120 of the datapath for the case when the distortion correction is done prior to rasterization. The datapath starts upon being supplied a pattern to be exposed 121, presented e.g. as a vector data file.

Stage 122: The exposure area is segmented into smaller areas. In a preferred realization of the invention these areas are small (or of about the same size) in comparison to the area of the beam array field of the multi-bream writer. Corrections that can be applied in the vector domain (e.g. proximity effect correction) may be carried out to all chunks independently, possibly in parallel, and the resulting data is sorted and coded in a way to improve computation speed of the following steps. The output is a collection of chunks where all chunks contain a collection of geometries.

Stage 123: The pattern to be exposed is prepared for distortion corrected according to one of the above variants a), b) or c). Each of the variants comprises a step where particular features or point coordinates of the pattern to be exposed are assigned to a respective segment of the exposure area. In particular, variants b) and c) comprise a step where the pattern to be exposed is divided into smaller features.

Stage 124: Next, the distortion correction is performed separately for each segment. In accordance with certain embodiments of the invention, these corrections may include parameters such as scaling SX01, SY01 in both spatial directions X and Y, a rotation R01, an angle correction A01 and most importantly a X/Y-positioning-correction D01, as shown in FIG. 8C.

Stage 125 is Rasterization for the Multi-Beam Tool: The geometries of every feature are converted to a raster graphics array, where the pixel gray level represents the physical dose of the corresponding aperture image. Every pixel that is completely inside a geometry is assigned the gray level (intensity value) of the polygon, whereas the gray level of pixels that cross an edge of a geometry is weighed by the fraction of the area of the pixel that is covered by the geometry. This method implies a linear relation between the area of the geometry and the total dose after the rasterization. The doses are first calculated as floating point numbers; only later they are converted to the discrete set of dose values as supported by the PD device. As a result of rasterization the pixel data will be in the format of floating point numbers representing nominal dose values for the respective pixels.

Stage 126 comprises other pixel-based corrections, such as dose corrections and/or defective beam corrections. Details for these corrections can be found elsewhere and are not part of the invention. This step may be skipped if no pixel-based corrections are required.

Stage 127 provides Dithering: The dithering process converts the dose value data into gray value data, based on a predetermined gray value scale. This is a position-dependent rounding process that ensures that rounding errors are averaged over nearby pixels which, combined with oversampling, allows for a much finer dose variation than with the discrete set of dose values available for a single aperture (see section "Illustration of the Compensation Method"). This conversion can be realized by means of known algorithms for the conversion of visual image data into pixel graphics. It is possible to apply additional corrections (which are not part of the present invention) at this stage, provided they can be applied in the pixel domain, immediately before or after dithering depending on the actual correction (e.g. defective apertures correction).

Figure 1:
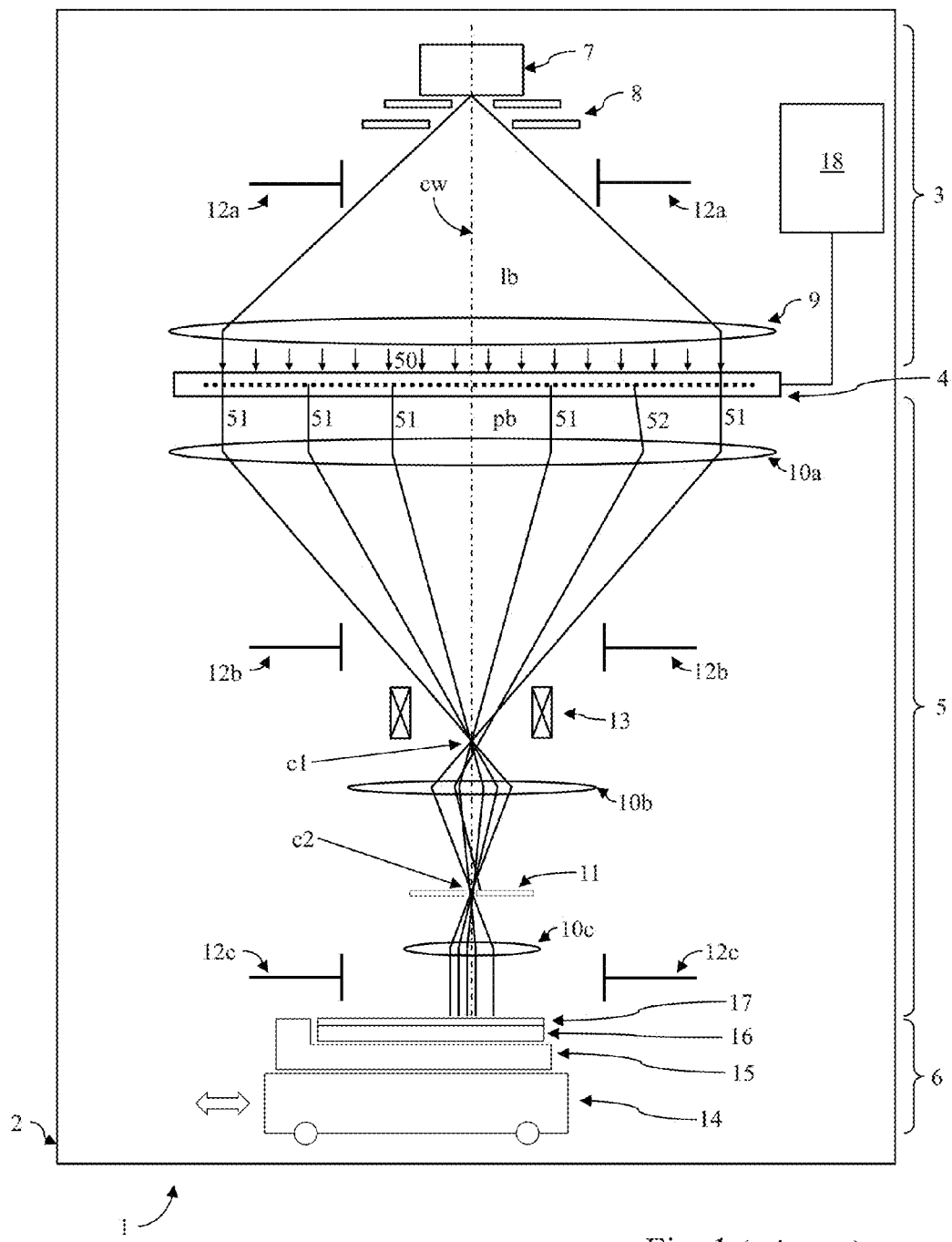
FIG. 1 a charged-particle multi-beam system of state of the art in a longitudinal sectional view.
Figure 2:
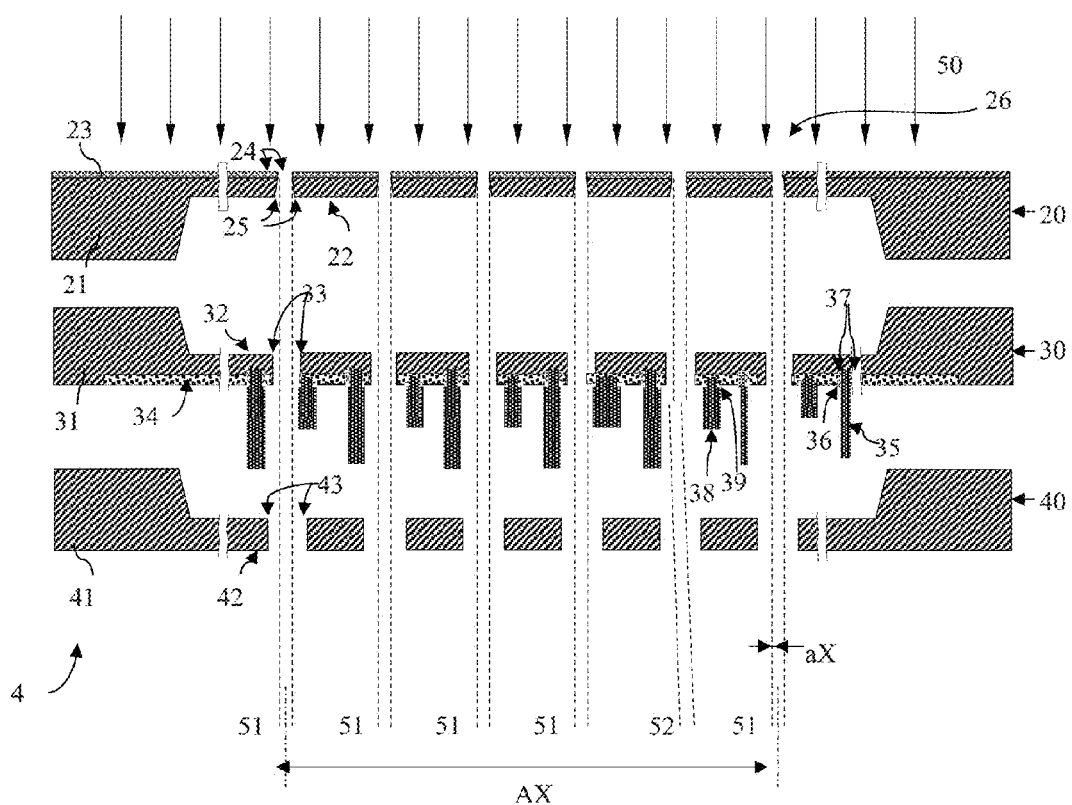
FIG. 2 a pattern definition system of state of the art in a longitudinal section.
Figure 5A:
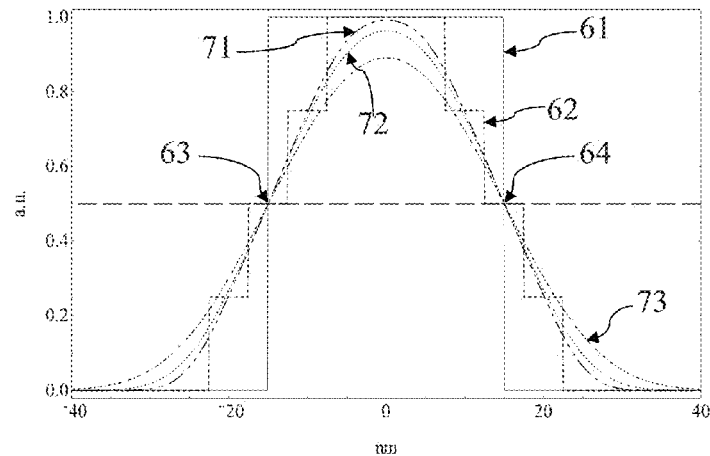
FIG. 5A shows intensity profiles of a 30 nm line as exposed with the multi-beam writer tool of the applicant.
Figure 5B:
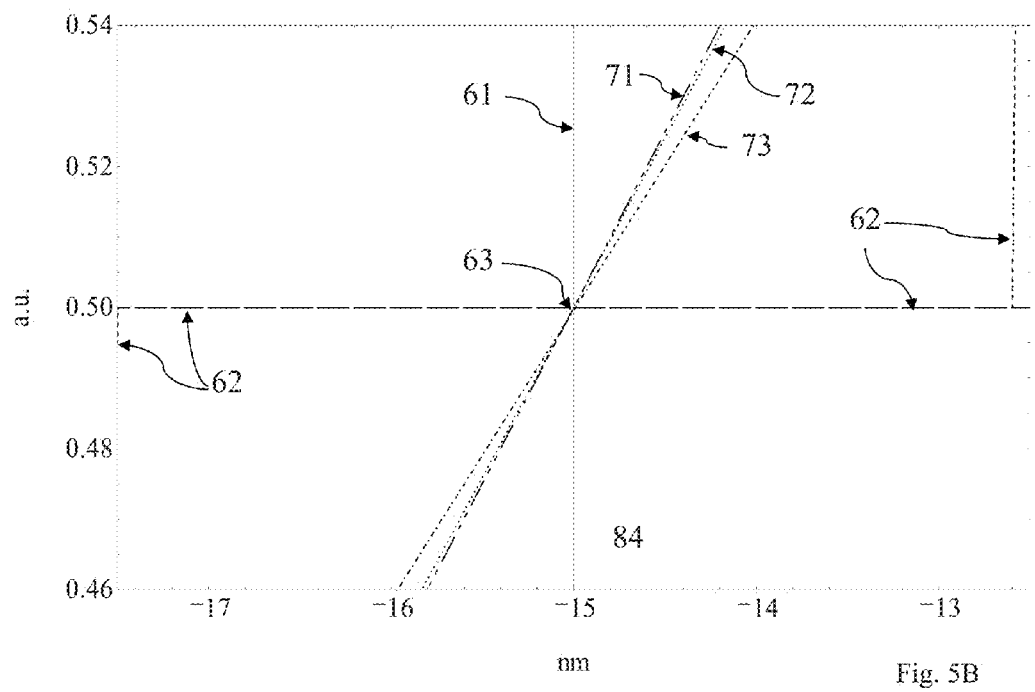
FIG. 5B shows a detail of FIG. 5A at the left-hand flank where the intensity profiles cross the 50% intensity level.
Figure 6:
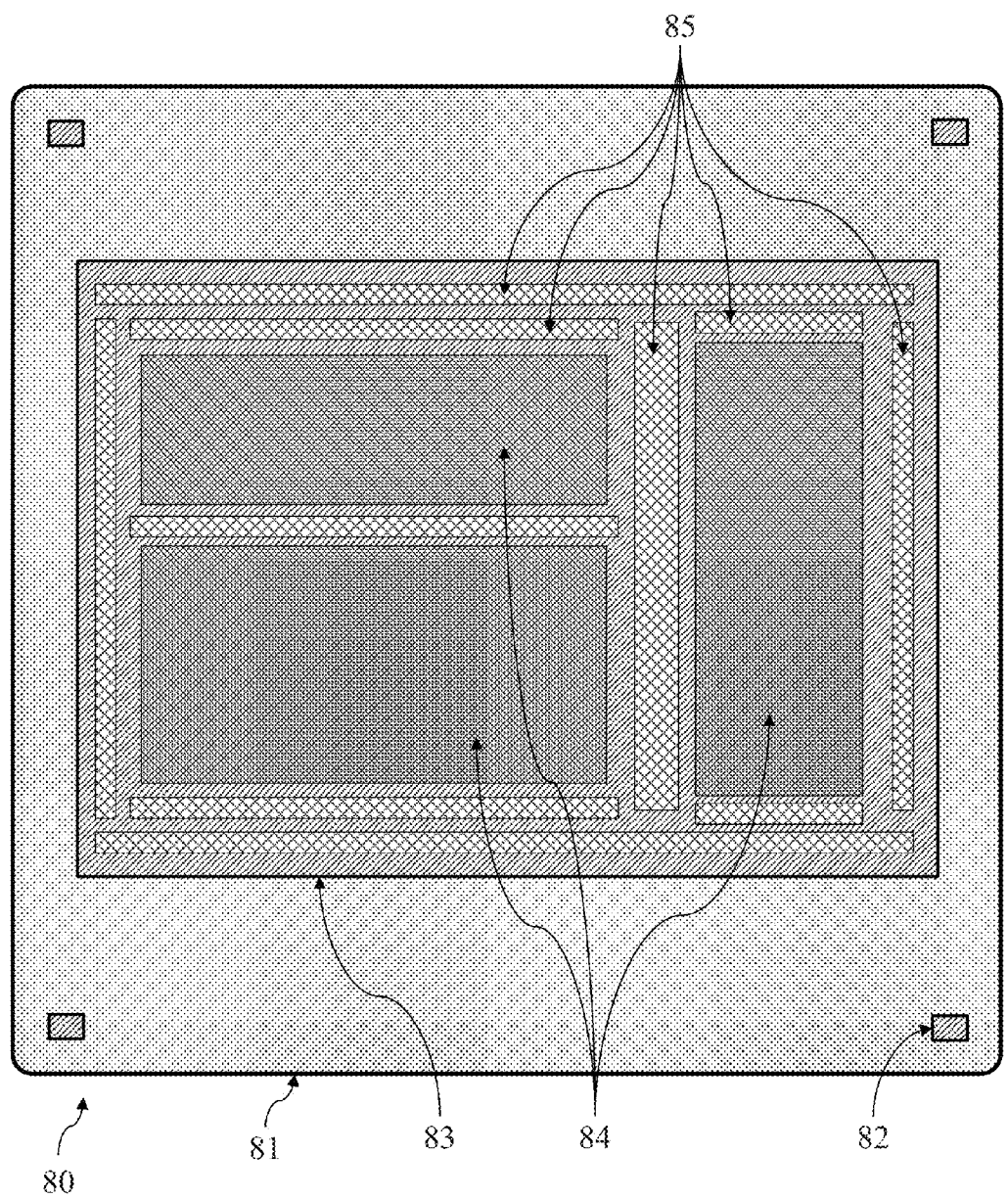
FIG. 6 shows a typical example of the layout of a 6" photomask substrate.

Stage 128 is Pixel Packaging: The pixel image obtained from stage 127 is sorted according to the placement grid sequence and sent to the pixel buffer 129 of the electronic pattern information processing system 18 (FIG. 1). The pixel data is buffered until a sufficient amount of data, typically at least the length of a stripe to be imaged on the target, is present which triggers the exposure of the stripe. The data is taken out of the buffer during the writing process. After the stripe has been written, the process described above starts anew for the pattern data of the next region, such as the next stripe.

As mentioned above and illustrated in the data path flowchart 130 of FIG. 14B, for variant b) and c) there is also the possibility to implement the stages of the distortion correction 133, 134, 135 after rasterization 132, as shown in FIG. 14B. In other respect, the same considerations apply as discussed above with FIG. 14A; in particular, the stages 131 and 136-139 are equivalent to the stages 121 and 125-129 of data path 120. To account for the discretized nature of a raster graphics, the dislocation corrections may additionally require a rounding of the dislocated locations to the raster coordinates.

The invention claimed is:

1. Method for computing an exposure pattern for exposing a desired pattern on a target in a charged-particle lithography apparatus, in which a particle beam is directed to and illuminates a pattern definition device comprising an aperture array composed of a plurality of blanking apertures through which said particle beam penetrates for writing said desired pattern by exposing a multitude of pixels within an exposure area on the target, said method taking into account a spatially dependent distortion of the target within the exposure area, with respect to dislocations transversal to the direction of the particle beam, wherein the method comprises:
(i) subdividing the exposure area into a plurality of non-overlapping sub-regions,
(ii) determining, for each of said subregions, a subregion dislocation, said subregion dislocation comprising a set of parameters describing the distortion of the target at the location of the respective subregion, (iii) providing the desired pattern as a graphical representation on the exposure area on the target, said graphical representation being composed of a plurality of graphical elements, each graphical element located at a respective position in the exposure area, (iv) modifying the graphical representation in accordance with the plurality of subregion dislocations, by dislocating each graphical element according to a subregion dislocation of the subregion which includes the respective position of the graphical element, obtaining a plurality of graphical elements thus dislocated, which compose a corrected graphical representation, (v) calculating, from the corrected graphical representation, an exposure pattern defined on the multitude of pixels, said exposure pattern being suitable to create a nominal dose distribution on the target realizing contour lines representing the desired pattern.

2. The method according to claim 1, wherein each dislocation comprises a displacement vector describing a linear translation of a representative point of the respective subregion within a plane transversal to the direction of the particle beam.

3. The method according to claim 1, wherein each dislocation comprises a plurality of parameters describing a dislocation of a representative point of the respective subregion within a plane transversal to the direction of the particle beam, said parameters including at least one of an angle of rotation, angle of shear, scaling along an X-direction and scaling along a Y-direction.

4. The method of claim 1, wherein the aperture array of the pattern definition device is imaged on the target, generating a beam array field on the target, which is composed of a plurality of aperture images, and wherein at least some of the subregions are smaller than the area covered by a beam array field.

5. The method of claim 1, wherein the graphical representation comprises graphical elements defined as polygons each comprising vertices, and in step iv) dislocation of each graphical element is performed by dislocating each vertex according to a subregion dislocation of the subregion which includes the respective position of the vertex.

6. The method of claim 1, wherein the graphical representation comprises graphical elements defined as polygons each comprising vertices, and in step iv) dislocation of each graphical element is performed by dislocating portions of polygons, where each portion is assigned to a respective subregion, according to a subregion dislocation of the respective subregion.

7. The method of claim 6, wherein a polygon crossing a boundary between subregions is divided into portions of polygons along the subregion boundaries.

8. The method of claim 6, wherein for each polygon comprising more than one portion, the portions of the polygon are re-joined into one polygon after being dislocated.

9. The method of claim 6, wherein critical polygon features are treated as completely belonging to one subregion.

10. The method of claim 6, wherein a polygon is divided into arbitrary portions, each portion falling within the area of a subregion with its complete area and/or with its center of mass and/or with the center of a bounding box minimally surrounding the portion and/or with any other reference point of choice, which subregion determines the subregion dislocation of the respective portion.

11. The method of claim 1, wherein parameters of the displacements of the subregions are interpolated using multivariate interpolation, and the interpolated displacement parameters are applied to relevant positions of the graphical elements, such as a center of mass or the vertices of a graphical element.

12. The method of claim 1, wherein after modifying the graphical representation in step iv) the graphical representation is rasterized to obtain a raster graphics, which is used for calculating the exposure pattern in step v).

13. The method of claim 1, wherein the graphical representation used in step iv) is a raster graphics.

14. The method of claim 13 wherein the raster graphics is obtained from a vector graphics by rasterization prior to step iv).

15. The method of claim 1, wherein in step i) the exposure area is subdivided into a plurality of non-overlapping subregions according to a regular grid.

16. Charged-particle multi-beam processing apparatus for exposure of a target using a structured beam of electrically charged particles, comprising:
an illumination system,
a pattern definition device and
a projection optics system,
the illumination system being configured to produce a beam of said electrically charged particles and form it into a wide beam illuminating the pattern definition device, the pattern definition device being configured to form the shape of the illuminating beam into a structured beam composed of a multitude of sub-beams in accordance with an exposure pattern, and the projection optics system being configured to project an image of the beam shape defined in the pattern definition device onto the target, thus exposing a multitude of pixels within an image area on the target,
said processing apparatus comprising a pattern information processing system configured for calculating a corrected graphical representation and a corresponding exposure pattern by:

(i) subdividing an exposure area into a plurality of non-overlapping sub-regions, (ii) determining, for each of said subregions, a subregion dislocation, said subregion dislocation comprising a set of parameters describing the distortion of the target at the location of the respective subregion, (iii) providing the desired pattern as a graphical representation on the exposure area on the target, said graphical representation being composed of a plurality of graphical elements, each graphical element located at a respective position in the exposure area, (iv) modifying the graphical representation in accordance with the plurality of subregion dislocations, by dislocating each graphical element according to a subregion dislocation of the subregion which includes the respective position of the graphical element, obtaining a plurality of graphical elements thus dislocated, which compose a corrected graphical representation, (v) calculating, from the corrected graphical representation, an exposure pattern defined on the multitude of pixels, said exposure pattern being suitable to create a nominal dose distribution on the target realizing contour lines representing the desired pattern.

* * * * *